United States Patent [19]
Reedy et al.

[11] Patent Number: 6,090,648
[45] Date of Patent: *Jul. 18, 2000

[54] METHOD OF MAKING A SELF-ALIGNED INTEGRATED RESISTOR LOAD ON ULTRATHIN SILICON ON SAPPHIRE

[75] Inventors: Ronald E. Reedy; Mark L. Burgener, both of San Diego, Calif.

[73] Assignee: Peregrine Semiconductor Corp., San Diego, Calif.

[*] Notice: This patent is subject to a terminal disclaimer.

[21] Appl. No.: 09/144,841

[22] Filed: Aug. 31, 1998

Related U.S. Application Data

[60] Division of application No. 08/571,661, Dec. 13, 1996, which is a continuation-in-part of application No. 08/389,671, Feb. 16, 1995, which is a continuation-in-part of application No. 08/090,400, Jul. 12, 1993, Pat. No. 5,416,043, said application No. 08/571,661, is a continuation-in-part of application No. 08/218,561, Mar. 24, 1994, which is a continuation-in-part of application No. 08/090,400.

[51] Int. Cl.$^7$ .......................... H01L 21/00; H01L 21/84; H01L 21/20

[52] U.S. Cl. .......................... 438/155; 438/166; 438/384

[58] Field of Search .................................. 438/155, 166, 438/384; 148/DIG. 77, DIG. 150

[56] References Cited

U.S. PATENT DOCUMENTS

| | | | |
|---|---|---|---|
| 4,385,937 | 5/1983 | Ohmura | 148/1.5 |
| 4,418,470 | 12/1983 | Naster et al. | 29/577 |
| 5,169,806 | 12/1992 | Hawkins et al. | 437/233 |
| 5,298,434 | 3/1994 | Strater et al. | 437/21 |
| 5,416,043 | 5/1995 | Burgener et al. | 437/63 |

FOREIGN PATENT DOCUMENTS 0235726  10/1987  Japan .

OTHER PUBLICATIONS

Wilcock, J.D.; Solid–State Electronics; Pergamon Press, Great Britain, 1971; vol. 14, pp. 315–325, Aug. 31, 1970.

Wolf, Stanley; Silicon Processing for the VlSI Era, vol. 2; Lattice Press, Sunset Beach, Ca.; pp. 735–736, 1990.

*Primary Examiner*—John F. Niebling
*Assistant Examiner*—Neah Berezny
*Attorney, Agent, or Firm*—Wilson, Sonsini, Goodrich & Rosati

[57] ABSTRACT

A method of making a self-aligned, integrated resistor load on ultrathin silicon on sapphire film, with the method being used to manufacture an FET and a resistor load. While the film can be used, for example, to manufacture a four transistor SRAM, it is not limited to such applications. The method encompasses an integral resistor load which can be integrated with analog components or formed as part of an integrated circuit for electrostatic discharge (ESD) circuitry, or the like. The resistor load can be integrally formed from the same silicon island which forms a corresponding transistor. Because the resistor load can be made from, and integral with, the ultra thin silicon material, it can be automatically self-aligned to the transistor. The self-aligned, integrated resistor loads are comprised of an insulating substrate, with a layer of silicon formed on the insulating substrate. The self-aligned resistor loads are integrally formed in the same film as the transistors and thereby require no second layer of deposited material such as polysilicon. The layer over the substrate additionally provides improved heat sinking capability, as well as a diffusion barrier which enables the silicon film to be appropriately implanted with dopant materials and annealed by standard fabrication processes.

10 Claims, 18 Drawing Sheets

METHOD OF MAKING A SELF-ALIGNED INTEGRATED RESISTOR LOAD ON ULTRATHIN SILICON ON SAPPHIRE

RELATED APPLICATION

This application is a division of U.S. patent application Ser. No. 08/571,661, filed Dec. 13, 1996, which is a continuation-in-part of patent application Ser. No. 08/389,671, filed Feb. 16, 1995 by inventor Ronald E. Reedy, entitled "Apparatus and Method Of Making A Self-Aligned Integrated Resistor Load On Ultrathin Silicon On Sapphire," which is a continuation-in-part of patent application Ser. No. 08/090,400, filed Jul. 12, 1993 by inventors Burgener and Reedy, and entitled "Minimum Charge FET Fabricated On An Ultrathin Silicon On Sapphire Wafer," now U.S. Pat. No. 5,416,043. The application Ser. No. 08/571,661 is also a continuation-in-part of patent application Ser. No. 08/218,561, filed Mar. 24, 1994 by inventors Mark L. Burgener and Ronald E. Reedy, entitled "High Frequency Wireless Communication System On A Single Ultrathin Silicon On Sapphire Chip," which is a continuation-in-part of patent application Ser. No. 08/090,400, filed Jul. 12, 1993 by inventors Burgener and Reedy, entitled "Minimum Charge FET Fabricated On An Ultrathin Silicon On Sapphire Wafer," now U.S. Pat. No. 5,416,043.

BACKGROUND

The field of the invention relates generally to a method for fabricating a semiconductor on insulator composite substrate, such as silicon-on-sapphire (SOS). More particularly, the field of the invention relates to a method for making a resistor, transistor, or memory cell utilizing an ultra thin silicon layer on a sapphire structure and for providing a resistive load which is self-aligned to a corresponding transistor, thereby eliminating a polysilicon layer and providing an extremely compact memory cell or analog circuit.

Generally, a field effect transistor (FET) controls current conduction from a source region to a drain region by application of voltage to a gate conductor. If the gate conductor is insulated from the source-drain conduction channel, the device is called an insulated gate FET. The most common gate structure is that of metal oxide semiconductor, or the MOSFET. A variety of requirements force designs which contain doped semiconductor material below the insulating gate structure, i.e., in the conduction channel. As device dimensions shrink, doping concentrations must be increased to scale the depletion layer widths and thereby maintain proper transistor operation.

Dopant atoms and electrically active states (hereinafter called "fixed charge") in the conduction channel region of MOSFETs are charged and discharged during operation of the device. Since fixed charge is immobile, it does not contribute to FET current conduction. However, the charging and discharging of fixed charges introduces parasitic charge in the transistor. Parasitic charge results from excess dopant atoms and electrically active states. Parasitic charge has many negative effects, including scattering of conduction carriers; variation in threshold voltage; introduction of buried channel operation; introduction of a body effect; complication of device modeling; increased complexity for device and process design; increased electric fields; and difficulty in scaling devices to smaller dimensions or voltages, among others.

Dopant atoms are introduced into MOSFETs for specific reasons such as to adjust threshold voltage or to control substrate currents, with the aforementioned adverse side effects accepted as necessary by-products of dopant atom introduction. It would be very desirable to be able to introduce only the specific type, quantity and location of dopant atoms which are necessary to achieve the desired electrical characteristics for the device, and to avoid or eliminate all other dopant atoms and their parasitic effects. The "ideal" semiconductor material would thus include a completely monocrystalline, defect-free silicon layer of sufficient thickness to accommodate the fabrication of active devices thereon. Ideal operation of MOSFETs would occur if there were no parasitic charge in the conduction channel.

Another requirement for MOSFETs is to set threshold voltage, which is the gate voltage necessary to initiate conduction. A common technique for setting threshold voltage is to modify the dopant concentrations in the channel region. However, this approach has the undesirable side effects associated with dopant charge mentioned above. Also, adjusting threshold voltage by ion implantation requires at least two and often four masking steps which increase cost and decrease yield.

A memory cell for a typical computer or microprocessor commonly stores bits of data as a charge on a floating gate. A nonvolatile or static random access memory (SRAM) typically stores data as a charge on the gate of a field effect transistor or as the presence or absence of charge on a plurality of cross-coupled pairs of field effect transistors. A bit logic state written in a static RAM (SRAM) remains in that same logic state until rewritten to another bit logic state, or until power is turned off. Also, because SRAMs are made from cross coupled active devices, SRAMs are the fastest type of memory. In a dynamic RAM data will disappear, typically, in less than a second unless constantly refreshed. For these reasons, SRAMs often are desirable as memory elements because they are fast, do not need refresh clocks, or involve other timing complexities which compete with normal memory access cycles and must be properly synchronized. Thus, for certain systems the SRAM predominates as the memory cell of choice due to its speed and simplicity.

As is well recognized in the art, it is frequently desirable to build SRAMs using field effect transistors (FETs) and, in particular, metallic oxide semiconductor field effect transistors (MOSFETs). Cells in conventional SRAMs have used FETs in primarily two configurations: a four MOSFET transistor configuration and a six MOSFET transistor configuration. SRAMs with four transistors in a cell are typically referred to as 4 T SRAMs, and SRAMs with six transistors in a cell are typically referred to as 6 T SRAMs.

Conventional 4 T and 6 T SRAMs present problems when fabricated using conventional semiconductor processing techniques. In addition to four transistors, each cell of a 4 T SRAM typically requires two resistors. The resistors are formed in a well-known manner to provide a resistance load for a typical MOSFET. To function properly, that is, to enable each memory cell to properly represent logic states, these resistors must be made of a high resistivity material. The resistors enable the MOSFET to perform logic switching. That is, the resistors enable the MOSFET to open and close to generate full swings between the power supply voltages. The switching between the power supply voltages represents the two logic states HIGH and LOW. The resistors thereby prevent inadvertent switching at insignificant power levels in a well-known manner. The resistors must be made from high resistivity material. This material does not exist in the remainder of the process. To use conventional processing techniques to manufacture active transistors together with high resistance loads on a single semiconductor wafer, an additional layer of material, such as polysilicon, often must be used. This adds complexity and cost to the basic CMOS process. Alternatively, if a high resistance layer were made in the substrate, unacceptable parasitic effects would result and the layout area would be unacceptably large. The resistors are constructed in the second layer of polysilicon in a well-known manner.

Creating this additional layer of material on the semiconductor wafer increases the number and complexity of processing steps required to manufacture an SRAM. These steps can be critical, time consuming and can present significant obstacles in fabricating an SRAM. For example, because of the extra polysilicon layer, the process may have to align separate layers and conductively connect the layers through contact holes or vias. The second layer may have to be connected with a supply voltage in a conventional manner. The steps disadvantageously may require precise lithography tolerances, for example, in order to align the layers. In addition to increasing cost and processing complexity, such steps may dramatically decrease process yield.

Adding layers to a device complicates the lithography process. In particular, each layer of material increases the maximum step height of the device. This can have the disadvantage of causing a depth of focus problem in the lithography process. To increase the depth of focus of the lithography process. expensive and complex equipment may be necessary, which substantially increases fabrication cost per chip. As a result, it is often desirable to eliminate additional layers in order to simplify the lithography process.

Also, it can be difficult to precisely control deposition of polysilicon in MOS processing with the requisite uniformity and conduction characteristics. Polycrystalline silicon (polysilicon) is composed of many small (sub-micrometer size) crystals with generally random orientation. In order to fabricate a useful semiconductor device, it typically is necessary to implant or diffuse dopant atoms into the polysilicon substrate. Conventional methods of ion implantation and subsequent annealing cause polycrystalline crystals to expand thereby reducing the polysilicon's resistivity and compromising its performance as an SRAM resistor. This obstacle can constrain the initial polysilicon deposition and subsequent processing temperature and times of the SRAM.

A six transistor (6 T) SRAM, typically includes four NMOS transistors and two PMOS transistors. In these 6 T SRAMs, the two PMOS transistors replace the high resistance resistors used in the 4 T SRAMs. In a typical 6 T SRAM, the complimentary n and p channel transistors are adjacent. Accordingly, an additional layer of material (like that used to form the 4 T SRAM resistors) ordinarily is not required. As a result, the 6 T SRAM fabrication process can eliminate some of the processing steps used to fabricate a 4 T SRAM. The 6 T SRAM technology also can reduce (by as much as a factor of 1000) the high leakage currents that are commonly found in 4 T SRAMs. This is due to the off current of a PMOS device being typically $10^{-12}$ Amps, whereas the resistors typically draw $10^{-8}$ to $10^{-9}$ Amps.

The fabrication of a 6 T SRAM, however, can present other problems. Because a transistor is more complex than a resistor, it requires more die area. Transistors typically have a larger critical area than the resistors. That is, they present a much larger area for possible defects. This large critical area can reduce manufacturing yield. Because 6 T SRAM technology replaces the resistors of the 4 T SRAMs with transistors, a memory cell comprising 6 T SRAMs typically has a larger critical area than a 4 T SRAM cell. Thus, there is a critical need to eliminate defects such as particles, dislocations or the like, which may give rise to leakage current and the formation of parasitic charge. This in turn may facilitate the formation of parasitic bipolar transistor action due to adjacent regions of n and p type material in a transistor of an SRAM memory cell.

Additionally, during the operation of either a 4 T or 6 T SRAM, a latch-up condition may occur between adjacent n and p channel transistors. This latch-up condition occurs because the substrate typically used in an SRAM does not fully insulate the different regions of the device. As is well known in the art, a "latch-up" conduction occurs when unwanted or parasitic npn and pnp bipolar transistor action causes a low resistance path between the power supply and ground. As a result, n and p channel transistors must be spaced apart whether they are used in an SRAM control circuitry, or in the core of an SRAM itself. Consequently, the need to isolate adjacent n and p channel transistors used in SRAMs can consume even more cell or die space. Since for a given defect density, large die area results in low yield, the end result can be a low yield, large die and highly expensive SRAM.

Previously, silicon-on-sapphire (SOS) has been used for high performance MOSFET microelectronics, primarily for applications requiring radiation immunity. Typically, a silicon film is epitaxially grown on a sapphire substrate. Ideally, the silicon film is thin compared to the source to drain separation (called the channel length) and the insulating substrate is thick enough to ensure no significant electrostatic coupling to a back plane. Due to crystal and thermal expansion mismatches between the silicon and the sapphire, the silicon films are typically heavily populated with crystalline defects and electrically active states. The dominant type of crystalline defects are commonly called "twins". The quality of the silicon films can be improved by increasing the thickness of the silicon, hence traditional SOS is made with silicon films between 400 and 800 nanometers thick. This film thickness is capable of supporting transistors with channel lengths down to about 1 micron. Submicron channel length devices cannot be made in traditional SOS materials as thinner films are required.

The advantages of utilizing a composite substrate comprised of a monocrystalline semiconductor layer, such as silicon, epitaxially deposited on a supporting insulative substrate are well recognized. These advantages include the substantial reduction of parasitic capacitance between charged active regions and the substrate and the effective elimination of leakage currents flowing between adjacent active devices. This is accomplished by employing as the substrate an insulative material, such as sapphire ($Al_2O_3$) and providing that the conduction path of any interdevice leakage current must pass through the substrate.

An "ideal" silicon-on-sapphire wafer may be defined to include a completely monocrystalline, defect-free silicon layer of sufficient thickness to accommodate the fabrication of active devices therein. The silicon layer would be adjacent to a sapphire substrate and would have a minimum of crystal lattice discontinuities at the silicon-sapphire interface. Previous attempts to fabricate this "ideal" silicon-on-sapphire (SOS) wafer have been frustrated by a number of significant problems.

A first significant problem encountered in attempts to fabricate the ideal SOS wafer is the substantial incursion of contaminants into the epitaxially deposited silicon layer. In particular, substantial concentrations of aluminum contaminants, diffused from the sapphire substrate, are found throughout the silicon epitaxial layer. The inherent consequence of a high concentration of aluminum contaminants, effectively acting as acceptor-type impurities in the silicon epitaxial layer, is that there are unacceptably high leakage currents between the source and drain regions of p-channel active devices, such as MOSFETs (Metal Oxide Semiconductor Field Effect Transistor) and MOSFETs (Metal Semiconductor FET). These leakage currents may be of sufficient magnitude that the p-channel active devices may be considered to be always in an "on", or conducting state.

The incursion of substrate-oriented contaminants into the silicon layer was found to be an inherent consequence of high temperature processing steps. Such steps are typically utilized in both the initial epitaxial deposition of the silicon layer and the subsequent annealing of the silicon layer to reduce crystalline defects contained therein. Thus, it was recognized that high temperature annealing needed to be avoided to prevent the substantial incursion of substrate-orientated contaminants into the silicon layer.

However, in the absence of a high temperature anneal, a second problem appears. The crystalline quality of the silicon layer, as epitaxially deposited, is of insufficient quality to permit the fabrication of active devices therein. It was discovered that the dominant crystal defects, i.e., twins, could be eliminated by solid phase epitaxial (SPE) regrowth, a process described in U.S. Pat. No. 4,177,084, entitled "METHOD FOR PRODUCING A LOW DEFECT LAYER OF SILICON-ON-SAPPHIRE WAFER", issued to Lau et al. As described by Lau et al., the SPE process provides a low temperature subprocess for improving the crystallinity of the silicon epitaxial layer of a silicon-on-sapphire composite substrate. The SPE process involves the high energy implantation (typically at 40 KeV to 550 KeV) of an ion species, such as silicon, into the silicon epitaxial layer at a sufficient dose (typically $10^{15}$ to $10^{16}$ ions/cm$^2$) to create a substantially amorphous silicon layer lying adjacent the silicon/sapphire interface while leaving a substantially crystalline layer at the surface of the original epitaxial layer. The thickness of the silicon epitaxial layer is substantially that intended for the completed silicon-on-sapphire composite substrate (typically 3000A–6000A). The ion species is implanted through the majority of the epitaxial layer so that the maximum disruption of the silicon crystal lattice is near, but not across, the silicon/sapphire interface to ensure that the amorphous region is adjacent the sapphire substrate. Throughout the ion implantation, the sapphire substrate is kept below about 100° C. by cooling with Freon or liquid Nitrogen. A single step low temperature (600° C.) annealing of the composite substrate is then performed to convert the amorphous silicon layer into crystalline silicon. During this regrowth, the remaining crystalline surface portion of the silicon layer effectively acts as a nucleation seed so that the regrown portion of the silicon epitaxial layer has a common crystallographic orientation and is substantially free of crystalline defects.

While Lau's SPE process does significantly improve the crystallinity of the silicon epitaxial layer, it also facilitates the diffusion of aluminum from the sapphire substrate ($Al_2O_3$) into the silicon epitaxial layer, which dopes the silicon film p-type. The contaminant concentration resulting from the use of the SPE process is, unfortunately, sufficient to preclude the practical use of integrated circuits fabricated on composite substrates, such as silicon on sapphire, processed with this SPE subprocess. The reasons for the failure of active devices to operate correctly are essentially the same as given above with regard to composite substrates fabricated utilizing high temperature processing steps. Additionally, it has been observed that the method described by Lau et al., can leave enough electrically active states in the silicon epitaxial layer to preclude its use for fabrication of integrated circuits using silicon on sapphire.

U.S. Pat. No. 4,509,990, entitled "SOLID PHASE EPITAXY AND REGROWTH PROCESS WITH CONTROLLED DEFECT DENSITY PROFILING FOR HETEROEPITAXLIAL SEMICONDUCTOR ON INSULATOR COMPOSITE SUBSTRATES", issued to Vasudev, also describes use of ion implantation and solid phase regrowth to prepare a silicon-on-sapphire wafer. In a first principle embodiment, a method for fabricating a silicon-on-sapphire wafer very similar to that taught by Lau et al. is described with the additional requirement that the implantation energy and the ion dose are constrained such that they are sufficiently low so as not to exceed the damage density threshold of the sapphire substrate. In a second principle embodiment, the method describes a residual high defect density in the silicon layer near the sapphire substrate. Both embodiments utilize a method for controlling the temperature of the rear surface of the sapphire substrate by mounting the substrate on a heat sink with either a thin film of thermal paste or a thin film of silicon positioned intermediate to the rear surface of the substrate and the heat sink to provide a high heat conductivity interface therebetween. During the ion implantation, the temperature of the heat sink is held at a constant temperature (typically between –20° C. and 250° C.) resulting in a substantial thermal gradient between the rear surface of the sapphire and the silicon layer (typically 150° C. to 200° C.). Thus, it follows that the silicon layer is at a temperature falling in the range of 130° C. to 450° C.

It has been found that the process described by Vasudev can result in incomplete and non-uniform removal of crystalline defects and electrically active states from the silicon layer due to non-uniform thermal contact of the rear surface of the sapphire with the heat sink. When the thermal paste is used, any air bubbles in the paste interface can result in the nonuniform control of the silicon layer temperature. Additionally, further processing of the wafer is made more difficult because it is necessary to completely remove all residues of the thermal paste before proceeding. While coating the rear surface of the sapphire with silicon to provide a thermal interface removes the problem of cleaning paste from the wafer before further processing, it has also been found to provide non-uniform temperature control of the silicon layer, due to roughness of the rear surface of the sapphire. Even when great care is taken to smooth the rear surface of the sapphire prior to applying the silicon interface layer, a costly and time consuming process, warping of the substrate caused by heating and cooling of the sapphire during the implantation can result in non-uniform thermal contact between the rear surface of the sapphire and the heat sink.

U.S. Pat. No. 4,659,392, entitled "SELECTIVE AREA DOUBLE EPITAXIAL PROCESS FOR FABRICATING SILICON-ON-INSULATOR STRUCTURES FOR USE WITH MOS DEVICES AND INTEGRATED CIRCUITS", issued to Vasudev, describes another method for tailoring defect densities in regions of silicon on insulator wafers. Using this process, the defect structure and dopant concentrations near the interface between the silicon and the insulator are optimized for specific applications. However, such residual defects would make such silicon films inappropriate for construction of fully depleted transistors.

Other methods to prepare silicon on sapphire films have been described. U.S. Pat. No. 4,385,937, entitled "REGROWING SELECTIVELY FORMED ION AMORPHOSIZED REGIONS BY THERMAL GRADIENT", issued to Ohmura, describes a method which uses large thermal gradients during solid phase regrowth to enhance electron mobility in the silicon semiconductor layer. U.S. Pat. No. 4,775,641, entitled "METHOD OF MAKING SILICON-ON-SAPPHIRE SEMICONDUCTOR DEVICES", issued to Duffy et al., describes a method which intentionally forms a silicon layer adjacent an insulating substrate which has a high density of naturally occurring crystallographic defects. The purpose of this region is to substantially reduce the back-channel leakage that occurs when the device is operated after being irradiated. U.S. Pat. No. 4,588,447, entitled "METHOD OF ELIMINATING P-TYPE ELECTRICAL ACTIVITY AND INCREASING CHANNEL MOBILITY OF SI-IMPLANTED AND RECRYSTALLIZED SOS FILMS", issued to Golecki, describes use of ion implantation, recrystallization and oxygen diffusion to neutralize aluminum in the silicon film. The resulting oxide layer on the outward surface is subsequently densified and etched away. U.S. Pat. No. 4,523,963, entitled "METHOD OF FABRICATING MOS DEVICE ON A SOS WAFER BY STABILIZING INTERFACE REGION WITH SILICON AND OXYGEN IMPLANT", issued to Ohta, et al. describes use of implanting both silicon and oxygen to form recrystallized silicon films. An insulating layer is intentionally formed at the interface of the sapphire substrate. This insulating layer contains a high density of crystalline defects and dopants.

The paper entitled "THIN (100 nm) SOS FOR APPLICATION TO BEYOND VLSI MICROELECTRONICS", published in the Mat. Res. Soc. Symp. Proc. Vol. 107, pp. 365–376, 1988, authored by Reedy et al. discusses preparation techniques for SOS films using a double anneal with temperatures as high as 1050° C. Mention is made that adequate thermal contact must be made to prevent self annealing, however, no method of providing such contact is disclosed. Characteristics of bulk silicon and the SOS films thus produced are compared. Likewise, it is noted that n and p channel transistors which were fabricated in these SOS films exhibited performance characteristics which rivaled those of similar devices fabricated in bulk silicon. However, there is no discussion of fully depleted transistor operation in this paper.

The paper entitled "HIGH-QUALITY CMOS IN THIN (100 nm) SILICON ON SAPPHIRE", published in IEEE Electron Device Letters, Vol. 9, No. 1, pp. 32–34, January, 1988, authored by Garcia et al., presents substantially the same information as the above referenced Reedy et al. paper with more emphasis placed on the characteristics of the enhancement-mode n and p channel MOSFET's fabricated in the SOS material.

Significant progress has been made in producing SOS material having low concentrations of crystalline defects and substrate contaminants in the silicon. However, none of the conventional work in this field appears to recognize or address the effects or origin of charge states, which may also be present. Additionally, there are no known teachings on how to produce SOS materials and to fabricate devices therein which do not have the undesirable charge states discussed above.

Therefore, there has been a need for an SRAM that achieves an area savings of 4 T SRAMs but with the simplified standard processing steps found in a 6 T SRAM. There also has been a need for an SRAM with increased reliability and immunity to latch-up. Unfortunately, conventional SOS and SOI techniques above have limited the fabrication of such devices, largely for the reasons set forth above.

Therefore, what is needed is a method for fabricating a thin layer of substantially pure silicon on a sapphire or other insulating substrate which layer is extremely uniform in thickness. The transistors and/or resistors of an SRAM could be manufactured in this layer eliminating some of the disadvantages of conventional SRAMs. Such a uniform layer, if fabricated on a sapphire substrate would advantageously have its conductivity controlled by normal ion implantation due to the uniform definition imposed by the sapphire substrate. Such a layer would initially have no dopant atoms or electrically active states. Substantially no electrically active states is defined as an areal density of electrically active states which is approximately $3 \times 10^{11}$ $cm^{-2}$ to $5 \times 10^{11}$ $cm^{-2}$.

SUMMARY OF THE INVENTION

In order to overcome the above-described disadvantages and problems in conventional logic devices and methods of manufacturing such devices, an aspect of the present invention provides an ultra thin silicon on sapphire film which is used to manufacture a FET and a resistor load for example a four transistor (4 T) SRAM. However, the invention is not limited to an application to SRAM but rather encompasses an integral resistor load which can be integrated with analog components or formed as part of an integrated circuit for electrostatic discharge (ESD) circuitry, mixed signal circuitry, or the like. The resistor load can be integrally formed from the same silicon island which forms a corresponding transistor. Because the resistor load can be made from and integral with the ultra thin silicon material it can be automatically self-aligned to the transistor.

Another aspect of the present inventions provides a 4 T SRAM with a self-aligned integrated resistor load comprising an insulating substrate, a layer of silicon formed on the insulating substrate wherein the silicon layer is characterized by a thickness of less than approximately 1,100 Å or 110 nm. The 4 T SRAM comprises four NMOS transistors and two self-aligned integrated resistor loads, one for each pair of NMOS transistors, fabricated in the same layer of silicon formed on the insulating substrate, wherein the self-aligned resistor loads are integrally formed in the same film as the transistors and thereby require no second layer of deposited material such as polysilicon.

In accordance with another aspect of the invention, the ultra thin silicon layer disposed over the sapphire substrate provides improved heat sinking capability, as well as a diffusion barrier which enables the silicon film to be appropriately implanted with dopant materials and annealed by standard semiconductor fabrication processes while reducing point defects, dislocations, or the like.

In accordance with another aspect of the invention, because the resistor load can be fabricated integrally in the ultra thin silicon film disposed over sapphire material, the resistor load can be relatively uniform in film thickness and resistivity, resulting in precise resistance values.

In accordance with another aspect of the present invention, the resistor load can be made as small as the lithography limit of the first masking step. This enables the final size of the resistor load to be significantly smaller than both the PMOS transistors which are substituted for resistor loads in present six transistor SRAMs and the resistors in present four transistor SRAMs, thereby greatly decreasing cell size and maximizing cell density and, consequently memory capacity, while substantially eliminating point defects, dislocations, parasitic capacitances and the propensity for latch-up which ordinarily occur when logic cells are down sized.

DESCRIPTION OF THE PREFERRED EMBODIMENT

The following description is presented to enable a person skilled in the art to make and use the invention. Descriptions of specific applications are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the described or illustrated embodiments, but should be accorded the widest scope consistent with the principles and features disclosed herein. It is understood that both n- and p-type MOSFETs can be made simultaneously on the same sapphire substrate, thereby comprising complimentary MOS (or CMOS) circuits.

It is well understood that the self-aligned resistor aspect of the present invention can be implemented with a NMOS polarity transistor and n-type resistor. However, it will be appreciated by one of ordinary skill in the art that opposite polarity could be chosen for either or both depending upon circuit design.

An SRAM exhibiting improved features can be manufactured on an ultrathin intrinsic silicon film on an insulating substrate. Accordingly, a first aspect of the invention is to provide an ultrathin silicon film on an insulating substrate and processes for making such a film. Ideally, the intrinsic silicon contains no dopant atoms or electrically active states, either within the silicon film or at the interface between the silicon and the sapphire. While complete elimination of all charge states and dopant atoms is not feasible, trace amounts are acceptable within tolerances determined by the application. For example, if a threshold voltage is to be set to an accuracy of $\delta$ Volts, the total-charge in the silicon film should be less than about $\delta/C_{ox}$, where $C_{ox}$ is the gate oxide capacitance per unit area. Other tolerances can be determined similarly. For example, if the threshold voltage is to be accurate to within $\Delta V_t$=50 mV (0.05 V) of the desired value as determined by the metal work function, and a 5 nm thick $SiO_2$ dielectric layer is the gate insulator, then the total number of fixed charges $\Delta N$ (i.e., dopant charge plus band gap states plus interface states plus fixed charge in the insulators) in the structure should be less than $\Delta V_t C_{ox}/q$, where q is the charge on the electron. Thus, in this example, $\Delta N$ should be less than approximately $2 \times 10^{11}$ cm$^{-2}$, which is typical of most current devices. However, certain applications may require tighter threshold voltage control, thereby requiring that the total allowable fixed charge in the silicon film be less than approximately $3 \times 10^{11}$ cm$^{-2}$ while other applications may tolerate total allowable fixed charge up to as much as $5 \times 10^{11}$ cm$^{-2}$.

Figure 1A:
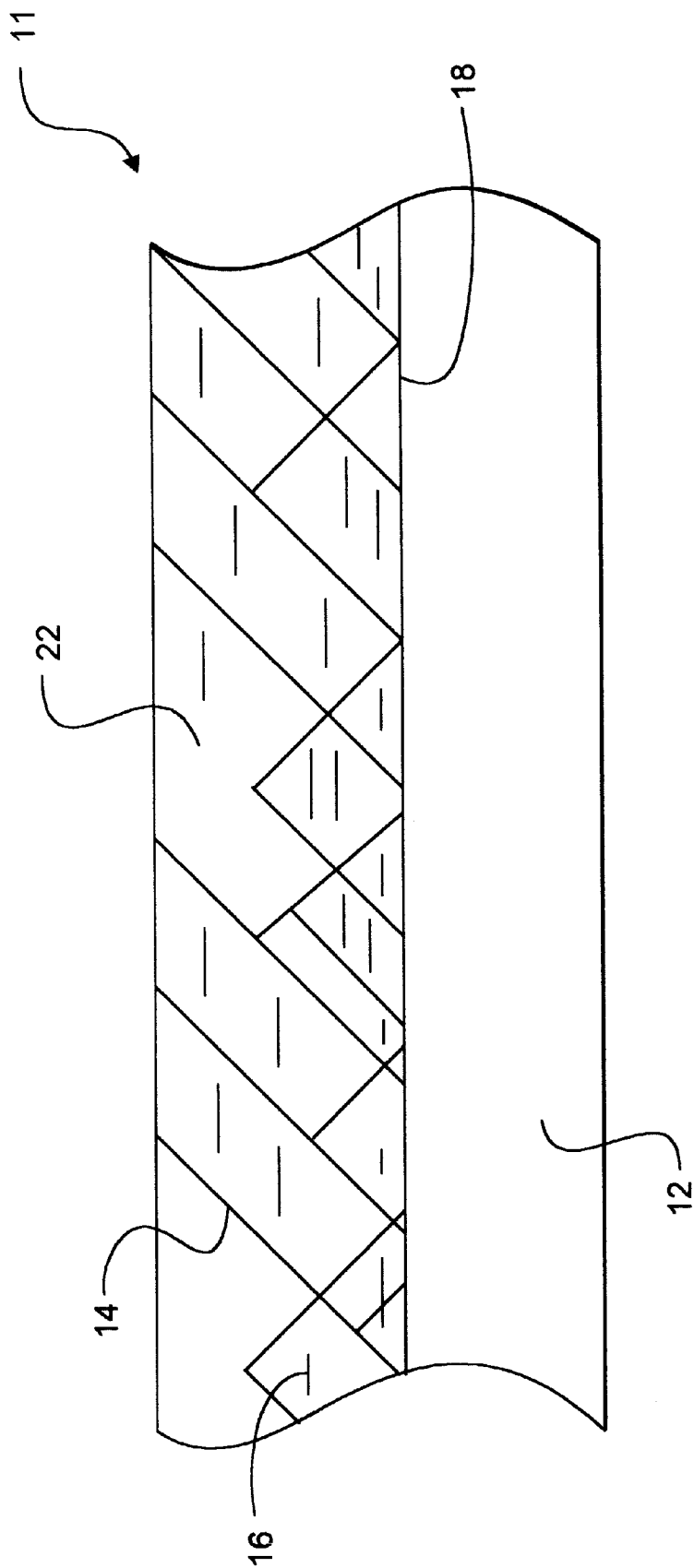
FIGS. 1A–1E illustrate steps in the process of converting an epitaxial silicon on sapphire wafer into a substantially pure silicon on sapphire wafer.

In an aspect of the invention, as shown in FIG. 1A, a 270 nm thick intrinsic silicon film 22 is deposited on a sapphire substrate 12 by epitaxial deposition to form a silicon-on-sapphire wafer 11. After the epitaxial deposition, the silicon film 22 contains a concentration of twin defects 14 and electrically active states 16. The thickness of the silicon film 22 is controlled during the epitaxial deposition process using standard processes.

Figure 1B:
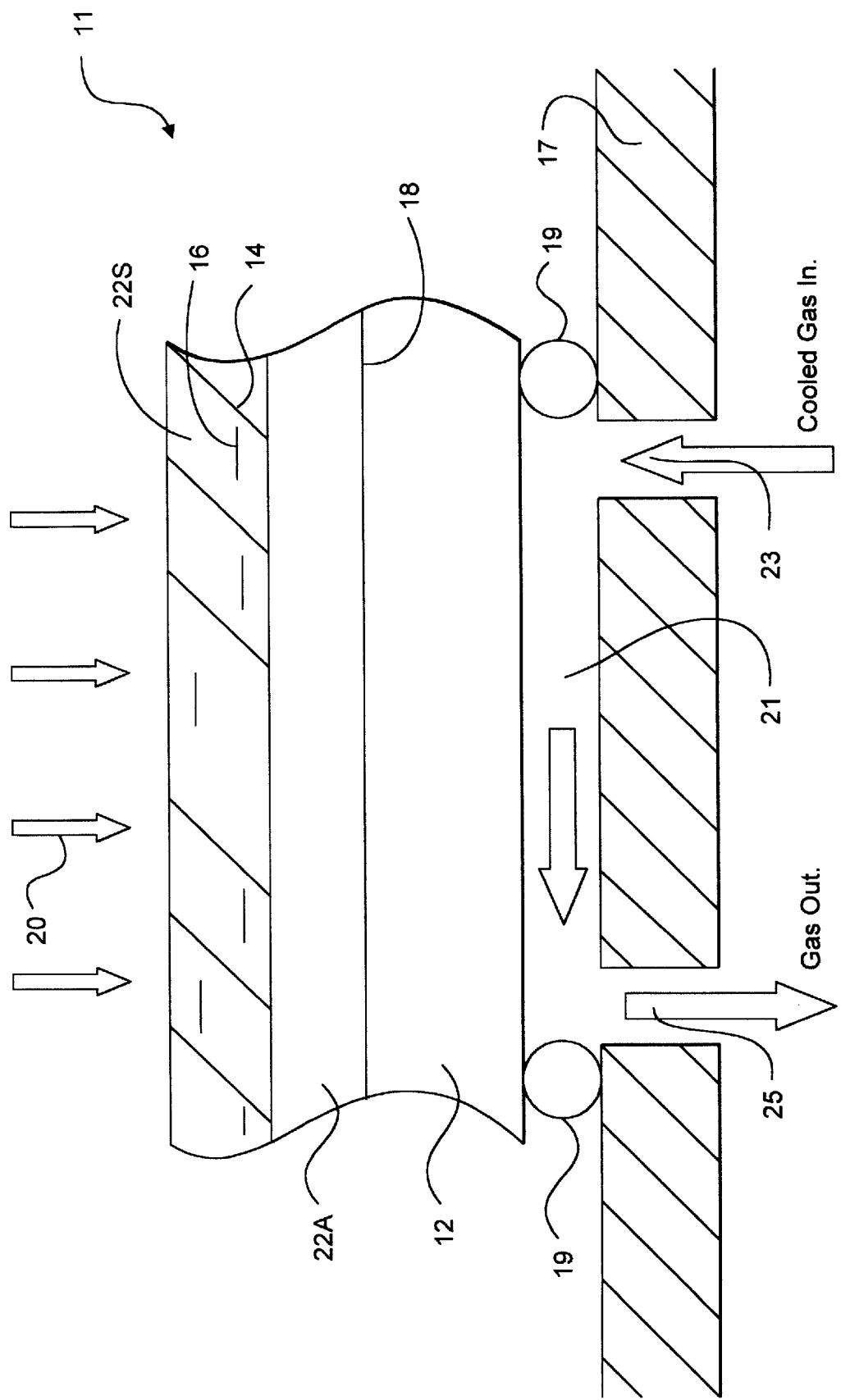

Referring to FIG. 1B, a 185 kev Beam of Si ions 20 is implanted into the silicon film 22 to a dose of approximately $6 \times 10^{14}$ cm$^{-2}$, thus creating a subsurface amorphous region 22A and leaving a surface monocrystalline silicon region 22S. The energy and dose of the beam of Si ions 20 are selected so that the amorphous region 22A extends from an interface 18, formed between the sapphire substrate 12 and the Si film 22, and up into the Si film 22 to a thickness which is greater than the desired final thickness of Silicon film. In this aspect, the amorphous region 22A is approximately 200 nm thick.

The amorphous region 22A in the 270 nm thick intrinsic silicon film 22 is created by implantation with the Si ion beam having an energy of 185 kev at a dose of $6 \times 10^{14}$, cm$^{-2}$ while maintaining the silicon film 22 at a uniform temperature at or below about 0° C. It has been found that this process will uniformly amorphize layer 22A without causing aluminum atoms to be released from the sapphire substrate 12 into the silicon film 22. While others have reported cooling the substrate by placing it on a cooled heat sink during implantation, none have paid particular attention to the temperature of the silicon film 22 during the implantation nor have they adequately addressed the issue of uniform cooling of the silicon film.

Previous cooling techniques include various techniques for placing the sapphire substrate 12 in contact with a cooled heat sink. Contact between the sapphire substrate and the heat sink was accomplished in a variety of ways including the use of a thermal paste layer interposed between the sapphire and the heat sink; depositing a layer of indium on the sapphire to provide more uniform contact with the heat sink; polishing the sapphire surface to improve contact with the heat sink; etc. However, these techniques created other problems and have been found to be inadequate for forming silicon films free of defects, dopants and charge states. A common shortcoming of these techniques is that it is very difficult to insure that the thermal contact between the sapphire and the heat sink is uniform over the entire sapphire surface. Non-uniform contact results in a nonuniform temperature within the overlying silicon film 22 which creates an amorphous layer 22A which is not uniformly amorphous due to partial self annealing. If the silicon film 22 is held at higher temperatures, the dose and/or energy must be increased to insure amorphization of layer 22A. If the temperature of the silicon film 22 is maintained at too high a temperature or not controlled at all, the ion implantation will cause the substrate temperature to rise, thereby increasing the required dose and/or energy required to amorphize layer 22A to a level where aluminum will out diffuse from the sapphire 12 into the silicon 22. An aspect of the present invention overcomes these shortcomings by cooling the sapphire with a flow of cooled gas and by adjusting the gas flow and/or temperature of the gas to insure that the silicon layer 22 is maintained at or below a predetermined temperature. For the dose and energy cited above, the substrate 12 is cooled to a temperature which maintains the surface of the silicon film 22 at a temperature preferably lower than about 0° C. One configuration for accomplishing these objectives is illustrated in FIG 1B.

Shown in FIG. 1B is a configuration for maintaining the silicon film 22 at a uniform temperature at or below about 0° C. The SOS wafer 11 is positioned on a support structure 17 in a manner which creates a chamber 21 between the sapphire substrate 12 and the support structure 17, for example, by placing an O-ring 19 between the support structure 17 and the SOS wafer 11. Cooled gas is circulated through the chamber 21 to cool the substrate 12. Since the gas has the same thermal contact with all areas of the substrate 12, uniform cooling is assured. Gas enters the chamber 21 through an inlet 23 and exits the chamber through an outlet 25.

Figure 1C:
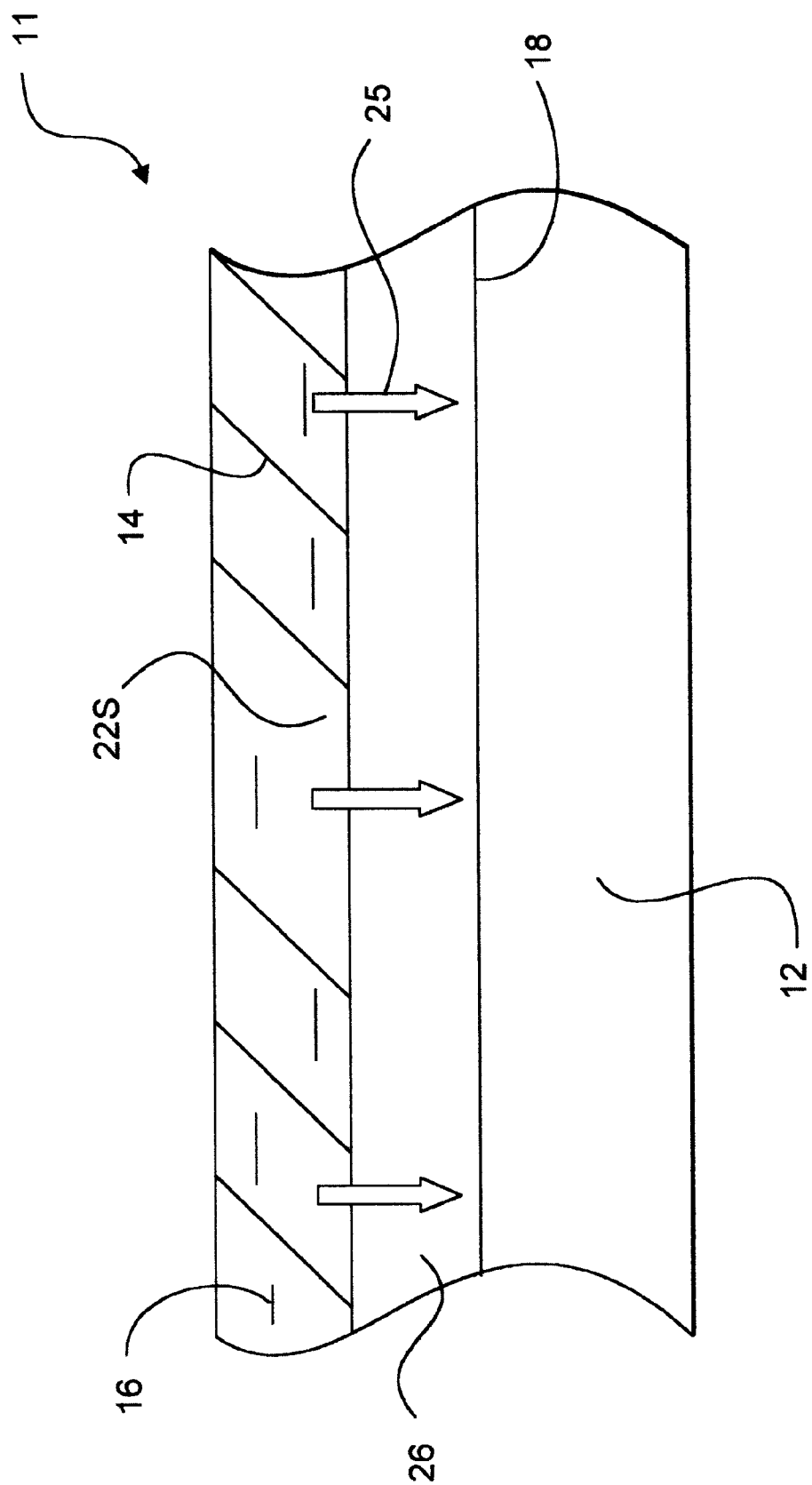

After creating the amorphous region 22A through silicon ion implantation, the SOS wafer 11 is subjected to a thermal anneal step at approximately 550° C. in an inert atmosphere (e.g. nitrogen) to induce solid phase epitaxial regrowth from the surface of the monocrystalline silicon region 22S downward through the amorphous region 22A to the interface 18. Thus the amorphous region 22A is regrown as a single crystal region 26. The direction of the regrowth from the monocrystalline silicon region 22S to the interface 18 is depicted by arrows 25 in FIG. 1C. Upon completion of this solid phase epitaxial regrowth, the anneal temperature is increased to approximately 900–950° C. in an inert atmosphere (e.g. nitrogen) to remove any remaining defects or states, thereby converting the amorphous region 22A (FIG. 1B) into a substantially pure single crystal region 26 (FIG. 1C) devoid of the twins 14 and the bandgap states 16 (FIG. 1A).

Figure 1D:
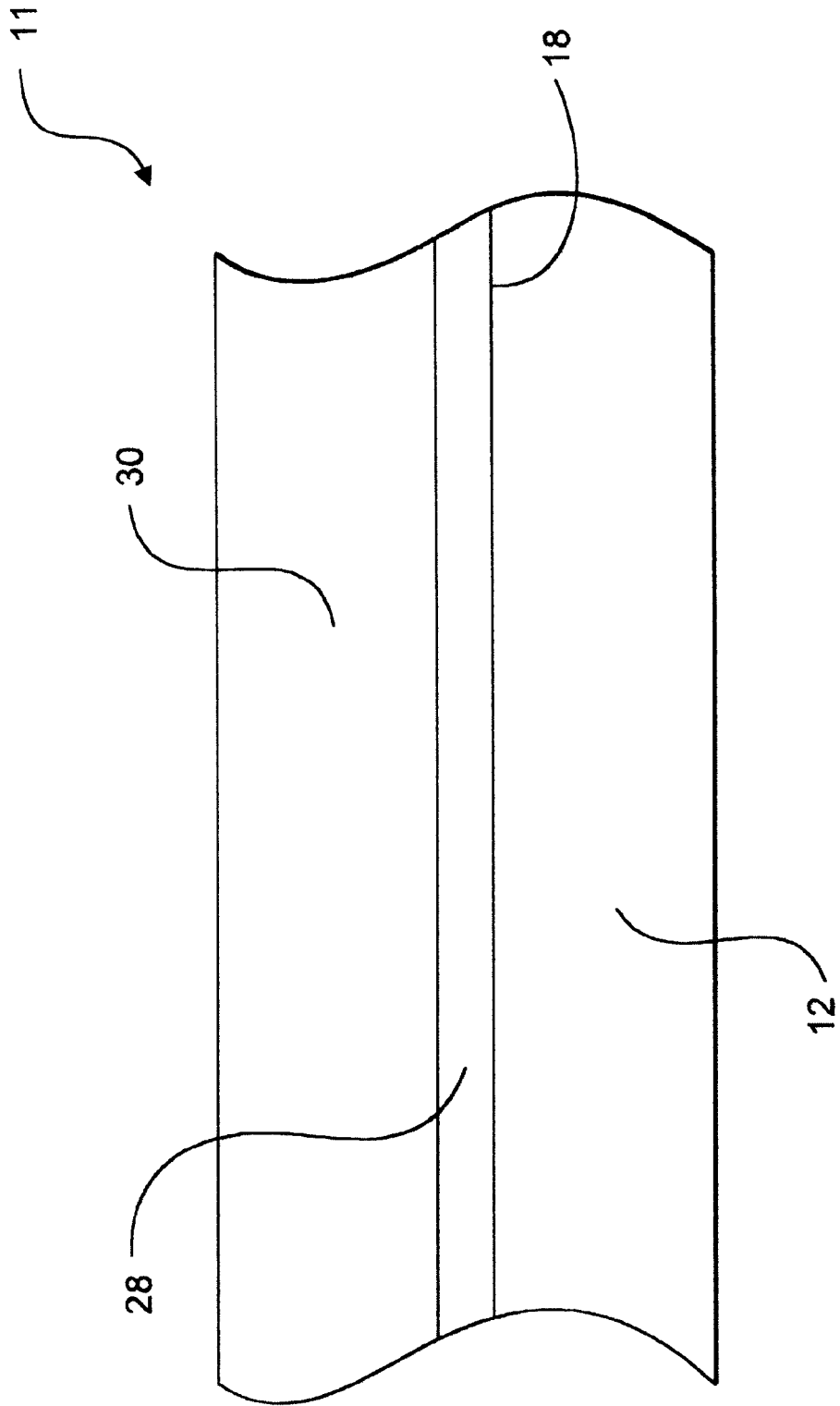

As shown in FIG. 1D, a silicon dioxide region 30 having a thickness of approximately 360 nm is then grown in the monocrystalline silicon region 22S by converting the ambient gas in the annealing system from nitrogen to an oxidizing ambient (e.g. steam or oxygen). The silicon dioxide region 30 is sufficiently thick to consume all the remaining twins 14 and band gap states 16 in the surface region 22S (FIG. 1C) of the silicon film 22. The silicon dioxide region 30 is sufficiently thick to leave an approximately 110 nm thick region of substantially pure silicon 28 (i.e., containing substantially zero defects and bandgap states) immediately adjacent the sapphire substrate 12.

Figure 1E:
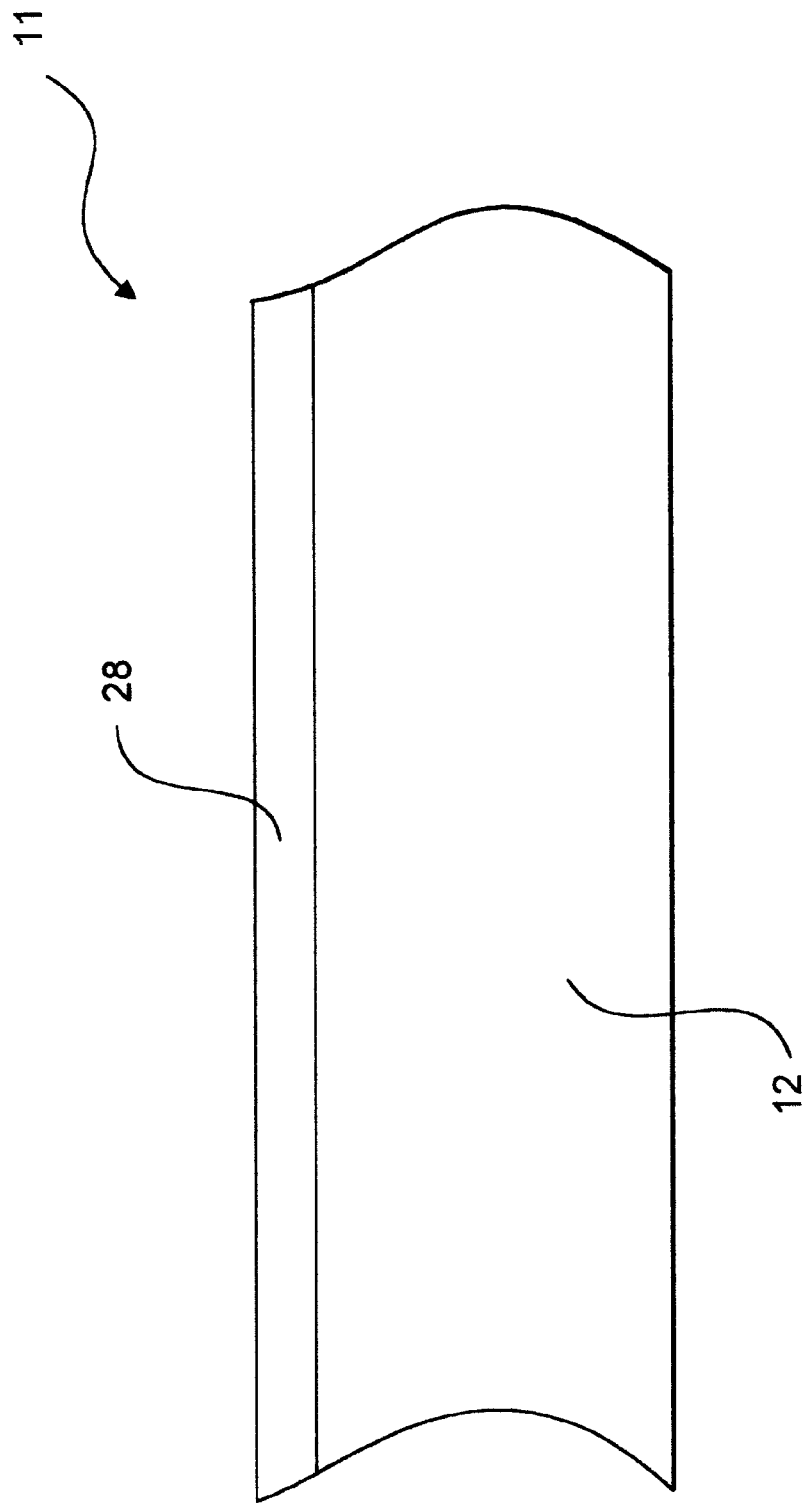

Referring now to FIG. 1E, the silicon dioxide film 30 is removed (etched) to result in an approximately 110 nm thick substantially pure silicon film 28 on the sapphire substrate 12. Thus, referring to FIG. 1C, the twins 14 and the states 16 in the upper portion of the silicon film are removed by forming the silicon dioxide film 30 and etching it away. Removal of the silicon dioxide film 30 may be delayed if it could serve a masking or other purpose. The substantially pure silicon film 28 on the sapphire substrate 12 is now suited for MOSFET fabrication.

The above processes of the present invention advantageously produce the substantially pure ultrathin silicon film 28. It will be appreciated that this aspect of the invention reduces processing costs and complexity by using only one implant cycle and one anneal cycle.

Design and fabrication of a fully depleted MOSFET are described with reference to FIGS. 2 and 3. In the following described aspects, all of the MOSFET processing steps are preferably limited to temperatures less than approximately 950° C. in order to maintain the purity of the silicon in channel regions. Additionally, all anneals performed in non-oxidizing conditions are performed at temperatures less than approximately 950° C. Such depletion mode FETs also can be used to fabricate logic devices such as SRAMs in accordance with an aspect of the present invention.

In one MOSFET aspect, formation of isolated n-type and p-type regions in the silicon layer 28 is accomplished using a well-known process often referred to as "local oxidation of silicon" (LOCOS). Unless otherwise stated, it will be understood throughout that there may be other standard semiconductor processing steps which will achieve the same or functionally similar results as described below. Substitution of these alternatives are considered to be within the scope of the present invention as long as they do not result in a processing step performed in non-oxidizing conditions which subjects the silicon layer 28 or any subsequent regions fabricated in the silicon layer 28 to temperatures in excess of approximately 950° C. For example, instead of using the LOCOS process to form the isolated n-type and p-type regions, alternative isolation techniques may also be employed. One such alternative process etches the silicon layer 28 (FIG. 1E) into individual islands (sometimes called "mesas"), to form the isolated n-type and p-type regions. Additional alternative processing procedures are disclosed in a book entitled "VLSI Technology", Second Edition, edited by S.M. Sze, published by McGraw-Hill New York, 1988, hereby incorporated herein by reference.

Figure 2A:
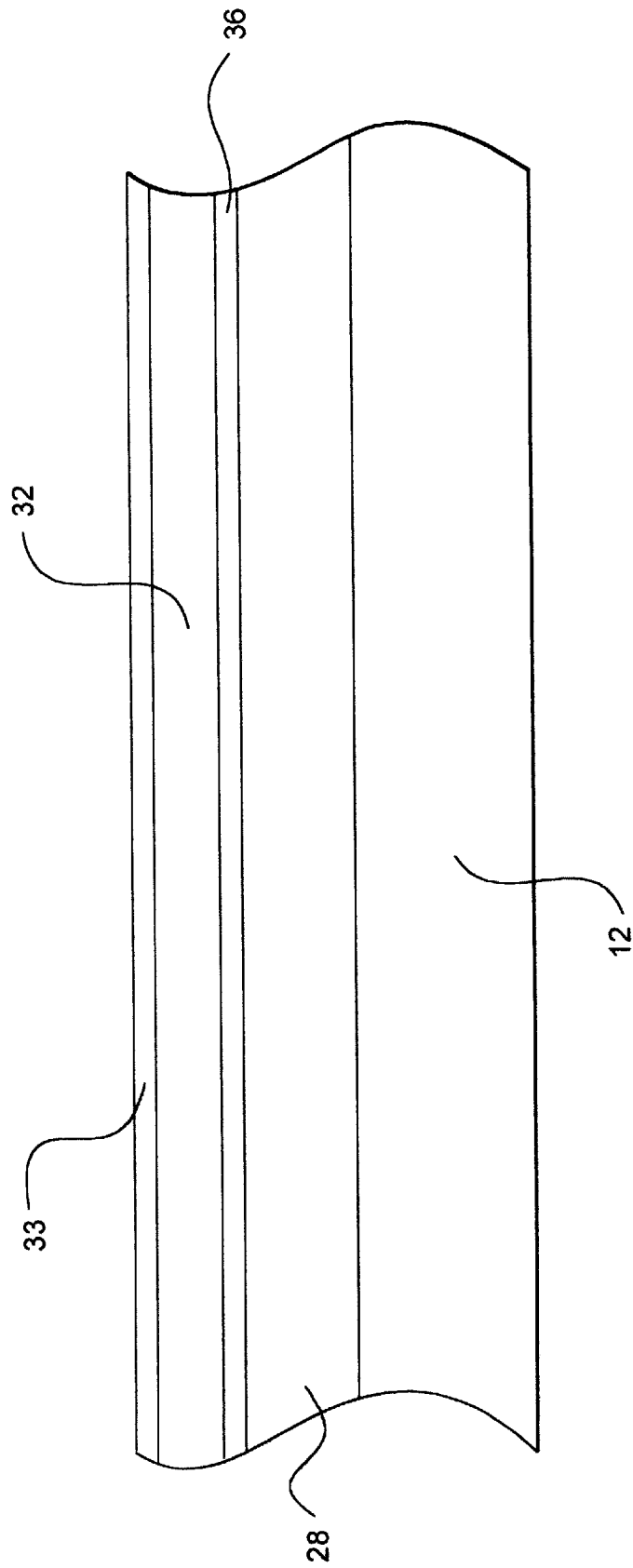
FIGS. 2A–2E illustrate a MOSFET and fabrication process steps used to manufacture the MOSFET in substantially pure silicon on sapphire material. Cross sectional views are shown for both n and p type transistors. These figures show the device and process through the first level of metallization.
Figure 2B:
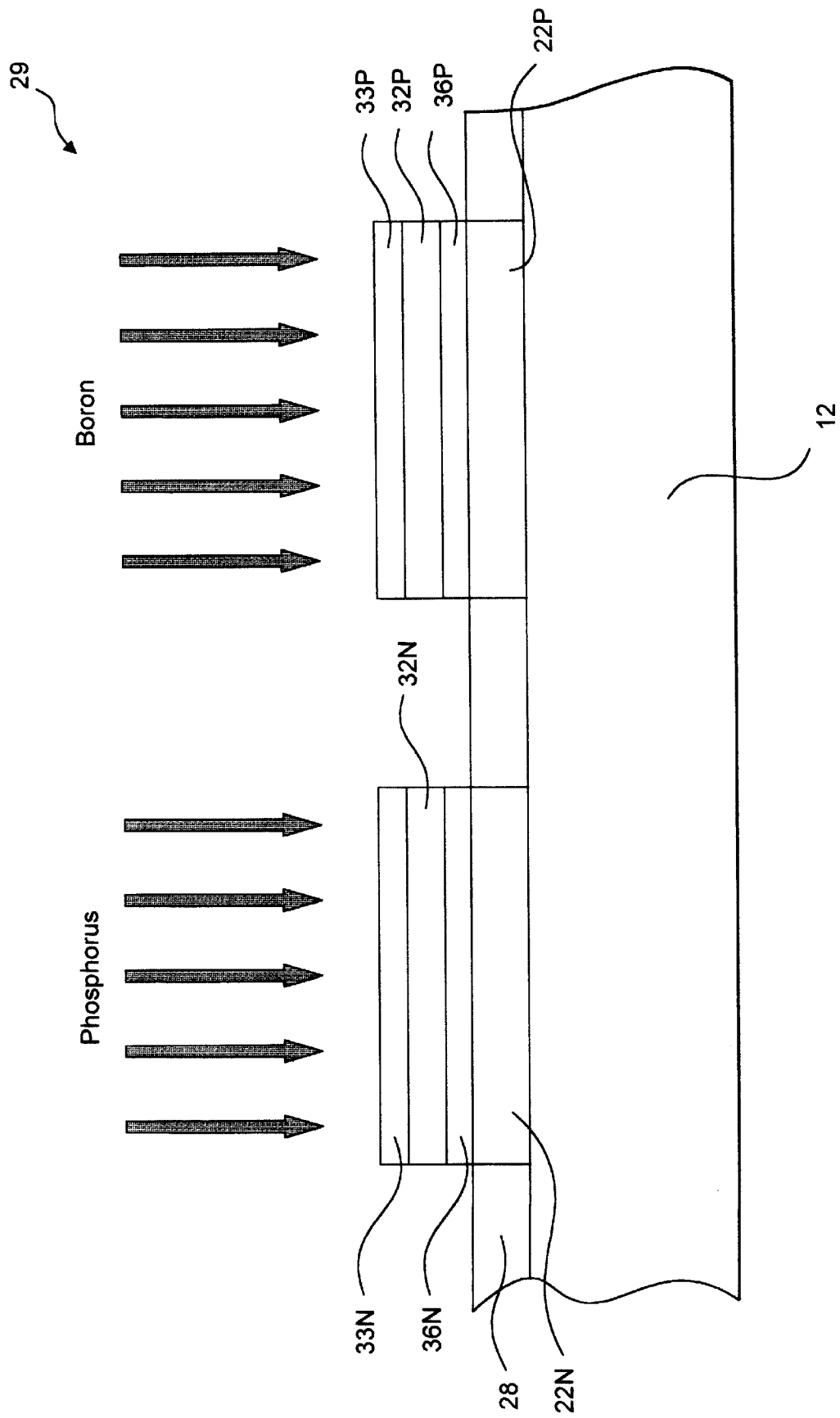

As shown in FIG. 2A, formation of isolated n-type and p-type regions with the LOCOS process begins with the deposition of a silicon dioxide layer 36, a silicon nitride layer 32 and a photo-resist layer 33 on top of the silicon layer 28 of the silicon-on-sapphire wafer 11 shown in FIG. 1E. Using standard masking and etching processes, individual islands (36p,32p,33p) and (36n,32n,33n) of the silicon dioxide layer 36, silicon nitride layer 32 and photo-resist layer 33 are formed on the surface of the silicon layer 28 as shown in FIG. 2B. Standard masking and ion implantation techniques are used to form a silicon n-type region 22N and a silicon p-type region 22P. For example, as shown in FIG. 2B, the silicon n-type region 22N is formed by ion implantation of the silicon layer 28 underlying the island (36n,32n,33n) with phosphorus and the silicon p-type region 22P is formed by ion implantation of the silicon layer 28 underlying the island (36p, 32p, 33p) with boron.

Figure 2C:
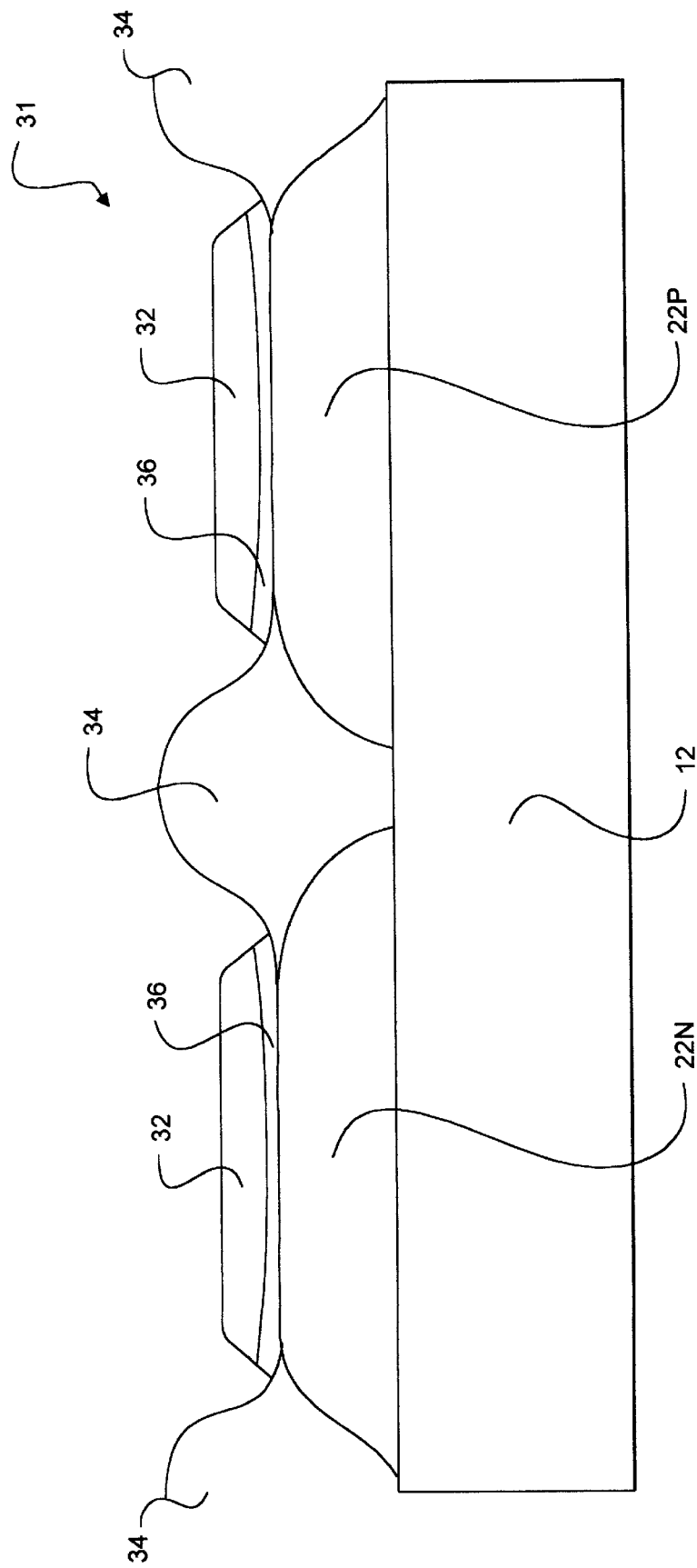

As shown in FIG. 2C, the silicon n-type region 22N is isolated from the silicon p-type region 22P by the growth of a silicon dioxide region 34. The silicon dioxide regions 34 are grown by introducing the wafer 29 shown in FIG. 2B into a high temperature (less than approximately 950° C.) oxidizing ambient environment. The silicon dioxide isolation regions 34 extend down to the sapphire substrate 12. Although the wafer 29 is in an oxidizing ambient, the silicon nitride layer 32 shields the silicon regions 22N and 22P, thereby keeping those regions from oxidizing. After growing the isolation regions 34, the silicon nitride layer 32 and the stress relief oxide layer 36 are stripped away.

FIG. 2C shows regions 22N and 22P fully isolated from each other by the silicon dioxide isolation regions 34 for complementary MOS transistors. Alternative isolation techniques may also be employed. For example, the silicon layer 28 (FIG. 1E) may be etched into individual islands (sometimes called "mesas"). Thus, upon removal of the silicon dioxide regions 34 by etching, the silicon islands 22N and 22P become individual isolated islands or mesas.

Figure 2D:
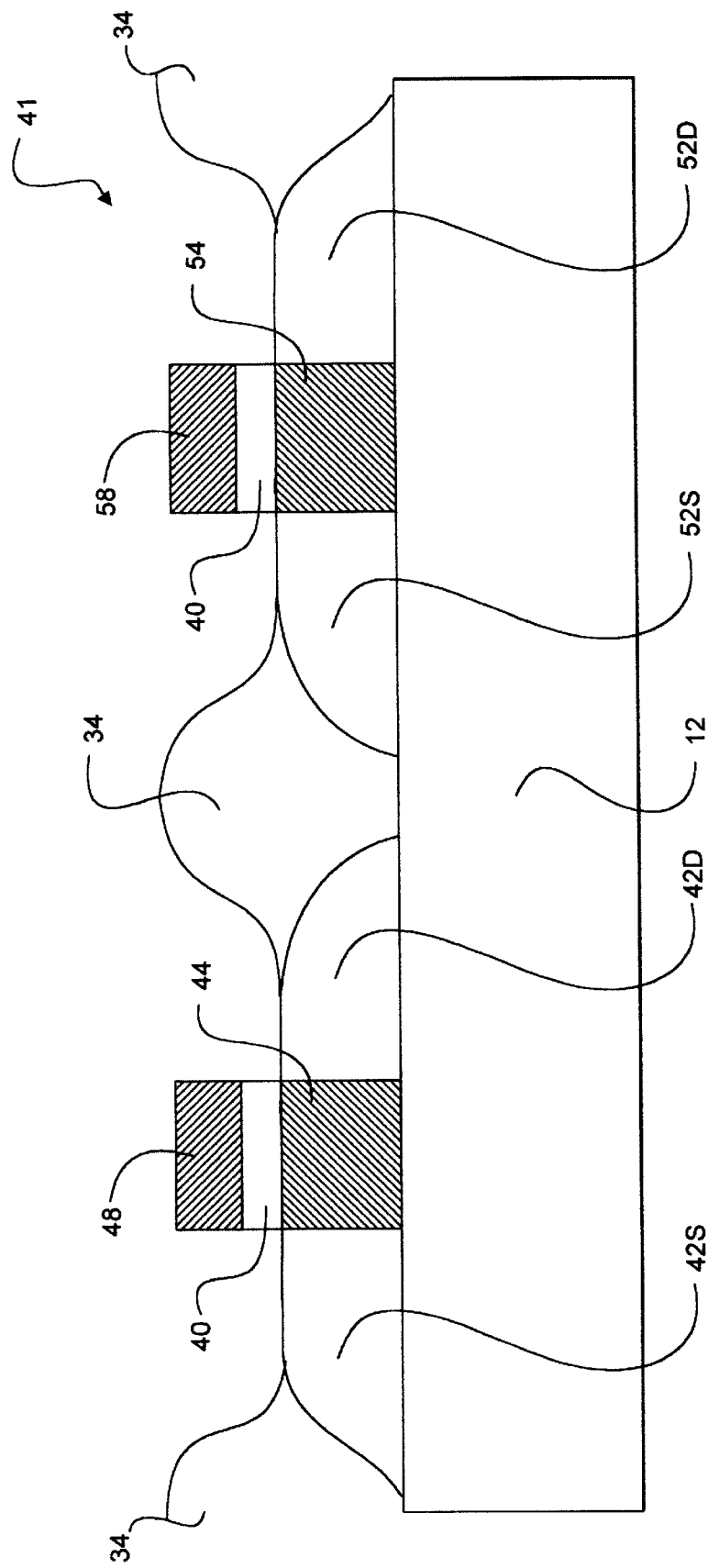

A subsequent stage 41 of the MOSFET process is shown in FIG. 2D. In stage 41, the n-type and p-type regions 22N and 22P (FIG. 2C) are further processed to form self-aligned sources 42S and 52S, conduction regions 44 and 54, and self-aligned drains 42D and 52D, respectively. Additionally, gate insulators 40 and gate conductive layers 48 and 58 form a control gate structure. The control gate structure is formed by thermal oxidation of the gate insulators 40 followed by deposition and patterning of a chosen gate conductive layer 48 for the p-channel and 58 for the n-channel. For electrostatic reasons, it is preferred that the gate length, i.e., the distance separating the source 52S from the drain 52D, be maintained at more than about 5–10 times the thickness of the conduction region. For example, a 500 nm gate length should be made in a silicon film thinner than about 100 nm, and preferably closer to 50 nm.

Referring to FIG. 2D, self-aligned sources and drains 42S, 42D, 52S and 52D are formed by ion implantation or diffusion. Doping the source and drain regions of thin silicon films is subject to certain limitations. For example, ion implantation doping can amorphize the entire thickness of the source/drain region. An amorphized film will not properly recrystallize from the sapphire substrate and high resistivity may result. Therefore, it is preferable that the source and drain regions be formed by diffusion doping since the sapphire substrate forms a diffusion barrier to the dopant atoms. Diffusion doping of the source/drain regions represents an improvement over conventional MOSFET designs using implantation doping in that very thin (i.e., shallow) source/drain regions 42S, 42D, 52S and 52D having low resistivities can be fabricated by means of a single diffusion step.

Since the sapphire substrate 12 is an effective diffusion barrier and since the depth of the source and drain regions 42S, 42D, 52S and 52D are determined by the thickness of the silicon film, forming shallow source and drain regions is controlled by the structure, not by diffusion time and temperature, as in conventional transistor processing. Therefore diffusion doping can be used for scaled down dimensions. Diffusion doping has several advantages over ion implantation including: the host silicon is not damaged or transformed into amorphous regions; the process is inherently scalable to the thinnest silicon films; and higher doping concentrations can be achieved.

Threshold voltage of the control gate structure is initially determined by correctly choosing the gate conductor material according to its so-called metal work function. If necessary, further adjustments to the threshold voltage are made by introducing appropriate dopant atoms into the conduction channel, for example by ion implantation into the conduction regions 44 and 54. In accordance with the present invention, no dopant atoms other than those introduced for threshold adjustment (or to ensure surface channel conduction, see below) are present in the conduction channel regions 44 and 54. The absence or low concentrations of dopants in the MOSFET aspects of the present invention represent an improvement over traditional MOSFET designs wherein substantial concentrations of dopant atoms are typically present for various reasons (e.g., as integral parts of traditional transistors; to provide isolation; as a byproduct of counterdoping; etc.). By fabricating MOSFETs in substantially pure silicon on sapphire in accordance with the present invention, only minimal concentrations of dopant atoms (if any) are present, thereby eliminating parasitic charge and its associated degradations discussed above.

Gate conductor layers 48 and 58 are often multilayer structures. In this case, the threshold voltage is determined by the characteristics of the primary gate conductor layer, i.e., the layer which is immediately adjacent the gate insulator 40. Conductive layers above the primary gate conductor layer are included for various reasons, especially to reduce series resistance (See FIG. 3 and discussion below for an example). However, such secondary gate conductive layers do not affect the threshold voltage of transistors. Each of the gate materials cited below has various applications when the material is in contact with the gate insulator 40.

$P^+$ and $N^+$ polysilicon gate materials, used in various combinations in n-type MOSFETS and p-type MOSFETS, are-useful in designing and fabricating digital and analog circuits, voltage reference circuits and memory type circuits. $P^+$ polygermanium is a good choice for high performance digital logic where symmetric threshold voltages for n- and p-type MOSFETs are desired. Any conductive material which has a metal work function at the center of silicon's band gap (i.e., equal to silicon's electron affinity plus half the band gap or more specifically a metal work function of 4.5–4.7 eV) results in symmetric threshold voltages for n- and p-channel MOSFETs. Examples of such materials are tungsten, chrome, indium tin oxide, and titanium nitride, among others. The material may be different or the same for each transistor type (regions 48 and 58) depending on the desired threshold voltage. Examples of choice of material and resultant threshold voltages are approximately as follows: $N^+$ polysilicon gate conductor results in $V_{tn}=0$ V and $V_{tp}=-1$ V; $P^+$ polysilicon gate conductor results in $V_{tn}=+1$ V and $V_{tp}=0$ V; $P^+$ polygermanium, tungsten, indium tin oxide or titanium nitride gate conductors result in $V_{tn}=+\frac{1}{2}$ V and $V_{tp}=-\frac{1}{2}$ V; where $V_{tn}$ and $V_{tp}$ are the threshold voltages of n- and p-channel MOSFETs, respectively.

As can be seen from the above discussion and referring to FIG. 2D, if a threshold voltages of +1 Volt for the n-channel and −1 Volt for the p-channel were desired, region 48 could be $P^+$ polysilicon and region 58 could be $N^+$ polysilicon (i.e., different materials). If threshold voltages of +½ Volt for the n-channel and −½ Volt for the p-channel were desired, regions 48 and 58 could be $P^+$ polygermanium, tungsten, indium tin oxide or titanium nitride (i.e., the same material). Numerous other material choices, and therefore other choices of threshold voltages, are also available.

The gate dielectric material 40 is grown and the gate conducting materials 48 and 58 are deposited using process conditions which avoid introduction of states or fixed charges into the channel regions 44 and 54. Specifically, processing temperatures and ambients are chosen to avoid generation of interface states or fixed charge in the dielectric. Therefore, as previously discussed, processing temperatures should be kept below approximately 950° C. Also, for P+ doped conductors as gate material 48 or 58, processing temperatures, times and ambients should be chosen to avoid diffusion of the dopant atoms from the gate conductors 48 and 58 through the gate dielectric insulator 40 into the silicon films 44 and 54. Diffusion barriers such as silicon nitride as part of the gate dielectric insulator 40 can be used to prevent such dopant migration.

Use of metal work function exclusively (i.e., no dopant atoms introduced into the conduction region) to set threshold voltage has the desirable effect of accurate and predictable threshold voltage control which is independent of process variations or certain device parameters.

Surface channel transistor behavior occurs when conduction occurs in the silicon channels 44 and 54 at the interface between the gate insulator 40 and the silicon films 44 and 54. In some designs, it may be desirable to intentionally induce surface channel conduction. This may be accomplished by implanting very small amounts of dopant atoms into the substantially pure silicon channel regions 44 and 54. This will result in surface channel conduction without significantly affecting the threshold voltage. Such a device is defined herein as an "intrinsic surface channel MOSFET." Additional dopant atoms, such as boron, phosphorous or arsenic, may be introduced into the channel regions 44 and 54 to further adjust the threshold voltage of the intrinsic surface channel MOSFET. Addition of dopant atoms in excess of that necessary to adjust the threshold voltage may introduce some of the adverse effects cited earlier, such as impurity scattering and possible threshold voltage variation. However, a device constructed in accordance with this invention contains only the dopant atoms necessary to induce surface channel conduction and to set a threshold voltage. Therefore, none of the other parasitic effects found in traditional MOSFETs are present. The present invention thereby minimizes the dopant charge in regions 44 and 54. This has the advantage of minimizing the associated adverse effects associated with higher concentrations of dopant charge.

A maximum amount of dopant charge can be introduced into channel regions 44 and 54. If the maximum amount is exceeded, the depletion region will not reach the sapphire 12, thus eliminating fully depleted operation. The maximum dopant charge is dependent on the silicon film thickness in the channel regions 44 and 54. For the preferred aspect, the regions 44 and 54 are approximately 100 nm thick and the maximum dopant density is approximately $1 \times 10^{12}$ cm$^{-2}$.

Figure 2E:
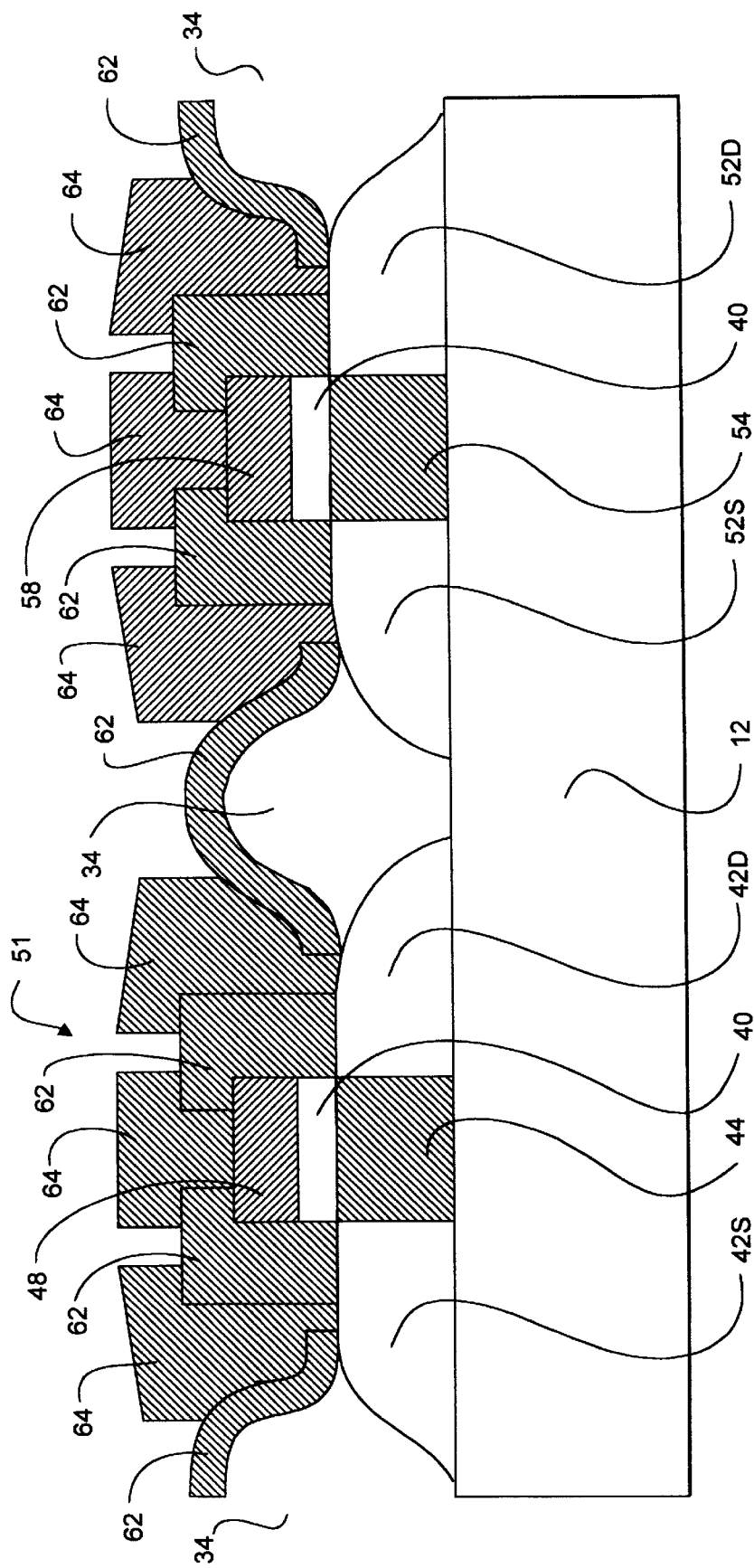

A next stage 51 of the MOSFET fabrication process is shown in FIG. 2E. In this stage, insulating layer 62 and metal layer 64 are deposited and patterned for interconnecting devices as desired. Specifically, an interlevel insulating layer 62 is deposited and patterned, followed by deposition and patterning of a metallic conductor interconnecting layer 64. Additional layers of insulators and metallic conductors may be added as needed (not shown). Another advantage of the present invention is apparent at this point, there are no opportunities for metal to diffuse into the source and drain regions as in many conventional MOSFET fabrication processes. In the present invention, after deposition and patterning of the metallic interconnect layer 64, an annealing step is performed. This annealing step serves two primary functions: to remove states and charge which may have been introduced during the previous processing steps and to sinter different metallic layers to form low resistance contacts. In conventional processing, source and drain junctions are deep enough to ensure that no metal will diffuse through them and into an underlying silicon substrate, thereby destroying transistors. In the current invention, such a failure mechanism does not exist since only sapphire 12 is found beneath the source and drain regions 42S, 42D, 52S and 52D.

Figure 3A:
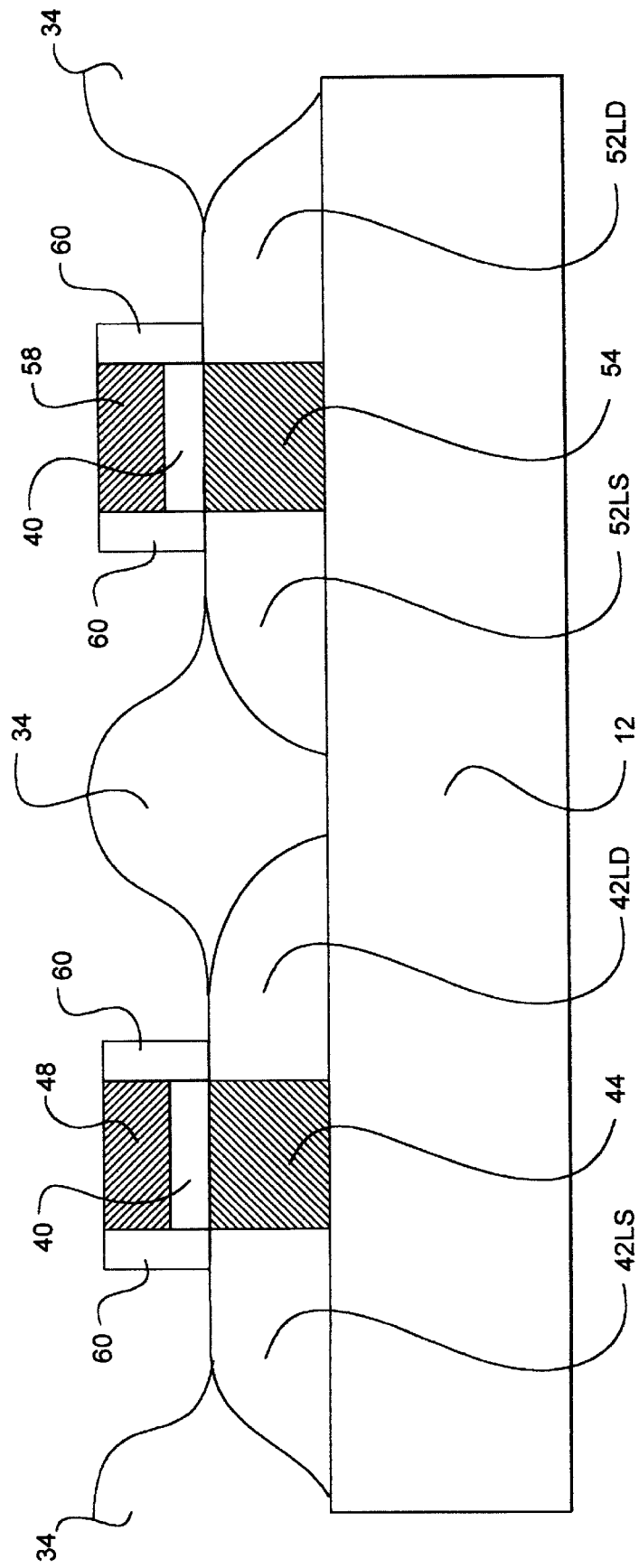
FIGS. 3A–3C illustrate an embodiment of the invention comprising adding to the device and process depicted in FIGS. 2, gate sidewall spacers, lightly doped drains (LDD), and self-aligned silicide (salicide). Cross sectional views are shown for both n- and p-type transistors. These figures show the device and process through the first level of metallization.
Figure 3B:
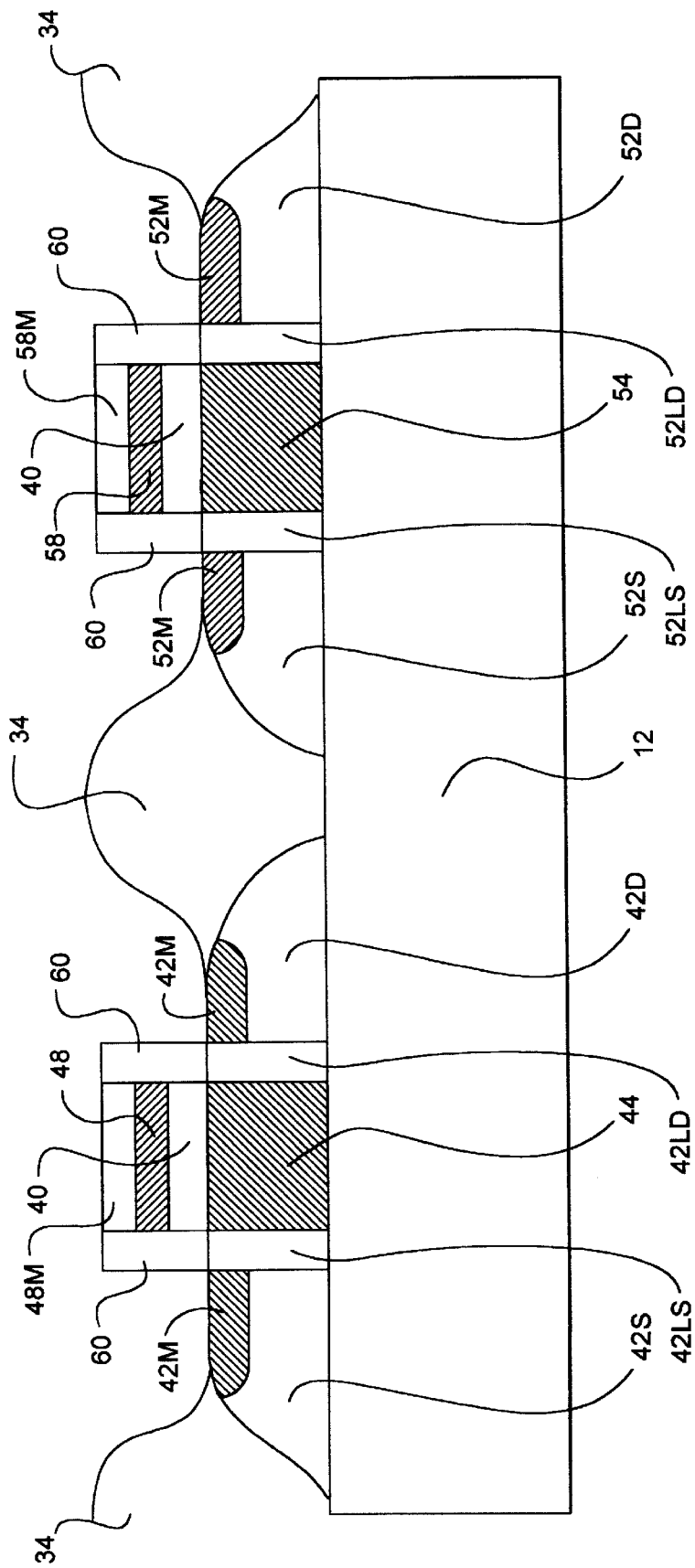
Figure 3C:
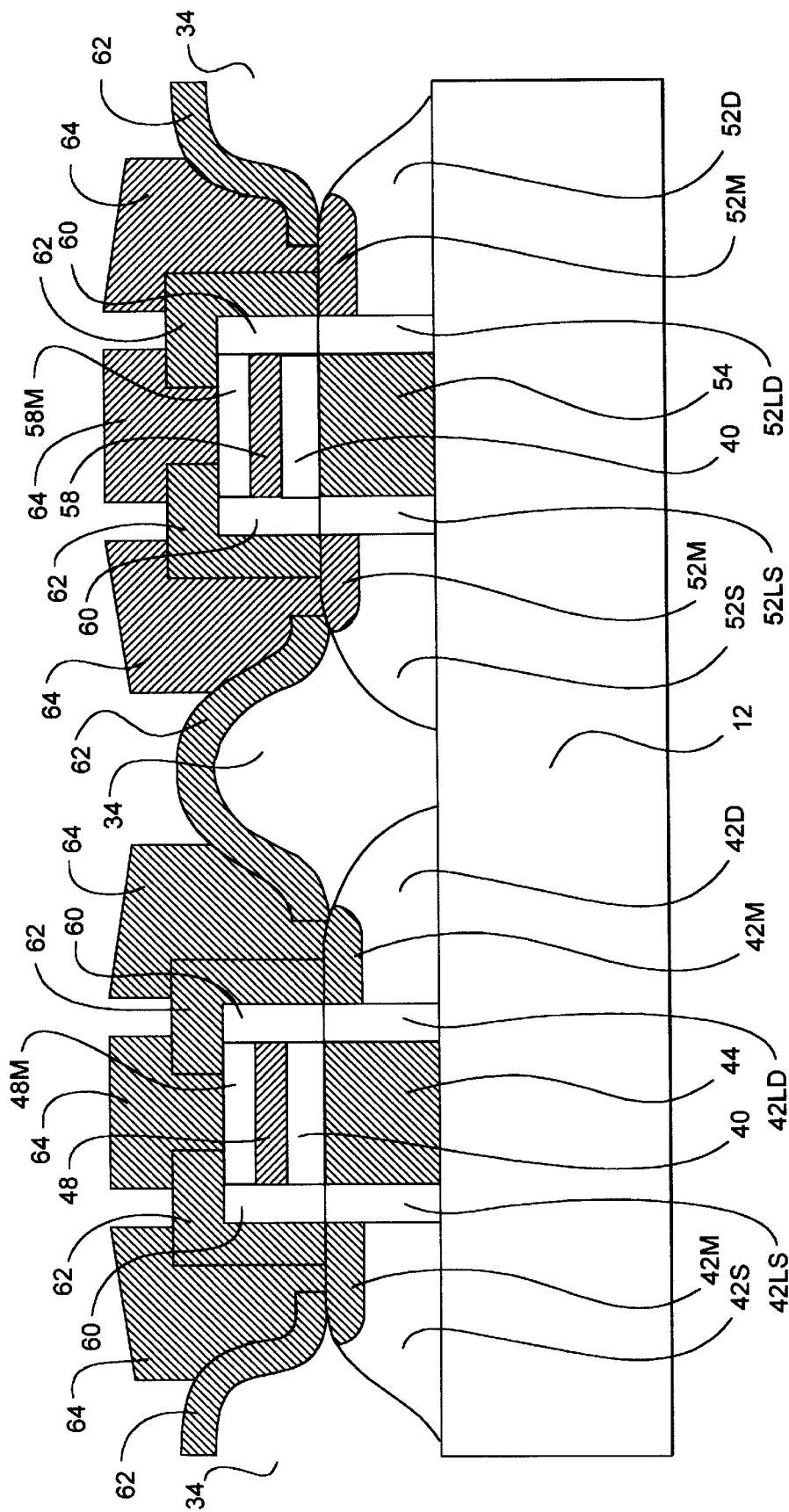

A further aspect of the invention comprises a lightly doped drain (LDD) structure or self-aligned silicide (salicide). This aspect is illustrated in FIGS. 3A, 3B and 3C, and may be implemented after the gate conductors 48 and 58 are patterned as discussed above and shown in FIG. 2D. Referring to FIG. 3A, after patterning the gate conductors 48 and 58, self-aligned lightly doped drain (LDD) regions 42LD and 52LD are formed by ion implantation or diffusion. The LDD reduces electric fields, thereby improving reliability and certain device characteristics such as drain breakdown voltage. However, the LDD also increases series resistance at both the drain and source, thereby decreasing output current. A tradeoff is therefore inherent in the choice of an LDD and different requirements will lead to different LDD designs. The advantages cited above for diffusion doping of the self-aligned sources and drains 42S, 42D, 52S and 52D also apply to doping the LDD structures.

In a self-aligned silicide (salicide) aspect of the present invention, a sidewall spacer 60 is deposited and etched adjacent to the gate structure comprising the gate insulator 40 and conductor 48, 58. Referring to FIG. 3B, final self-aligned sources and drains 42S, 42P, 52S and 52D are formed by ion implantation or diffusion. For appropriate gate conductors 48 and 58 (such as polysilicon or polygermanium) the structure is coated with a metallic material and reacted to form metallic compounds 48M and 58M in the upper portion of gate conductors 48 and 58 as well 42M and 52M in source and drain regions 42S, 42P, 52S and 52D. Stripping unreacted metal from sidewall spacers 60 completes the salicide (or germanide) processing. Referring to FIG. 3B, silicide regions 42M, 52M, 48M, and 58M are separated from each other by the sidewall spacers 60. The thickness of metallic regions 42M, 48M, 52M and 58M is controlled by the amount of metallic material which is deposited. Obviously, the salicide option exists independently of LDD doping level. Referring to FIG. 3C, a complementary MOS structure is shown with both LDD and salicide options included after metallization as described above for FIG. 2. The MOSFET can be completed according to processes well known in the art, maintaining temperatures below approximately 950° C.

Figure 4A:
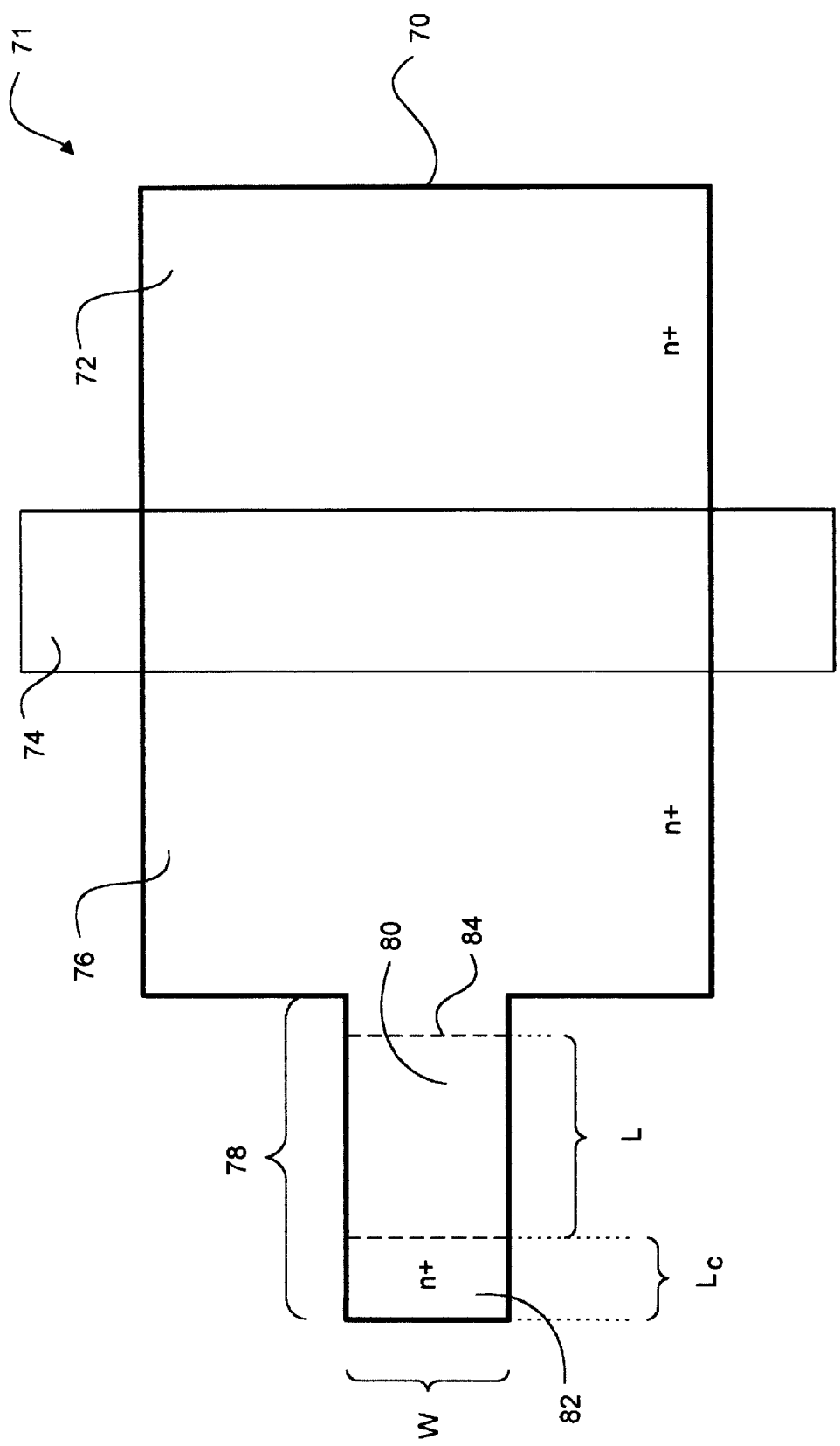
FIG. 4A shows a top view of an n-channel MOSFET with an integrated resistor fabricated in ultrathin silicon on sapphire in accordance with an aspect of the present invention.

With reference to FIG. 4A, a substantially pure (or intrinsic) island of silicon 70 is provided on a sapphire or other insulating substrate. The substrate is not shown as it underlies the silicon and is not visible as is well known to those of ordinary skill in the art. The process for producing silicon island 70 is described above with reference to FIGS. 1A–1E. The island is patterned by standard photolithography and etch techniques. An n-channel MOSFET 71 is then fabricated in the silicon island 70 as described with reference to FIGS. 2A through 2C. Source region 72 and drain region 76 are preferably formed by ion implantation or by diffusion doping as shown in FIG. 2D.

Figure 4B:
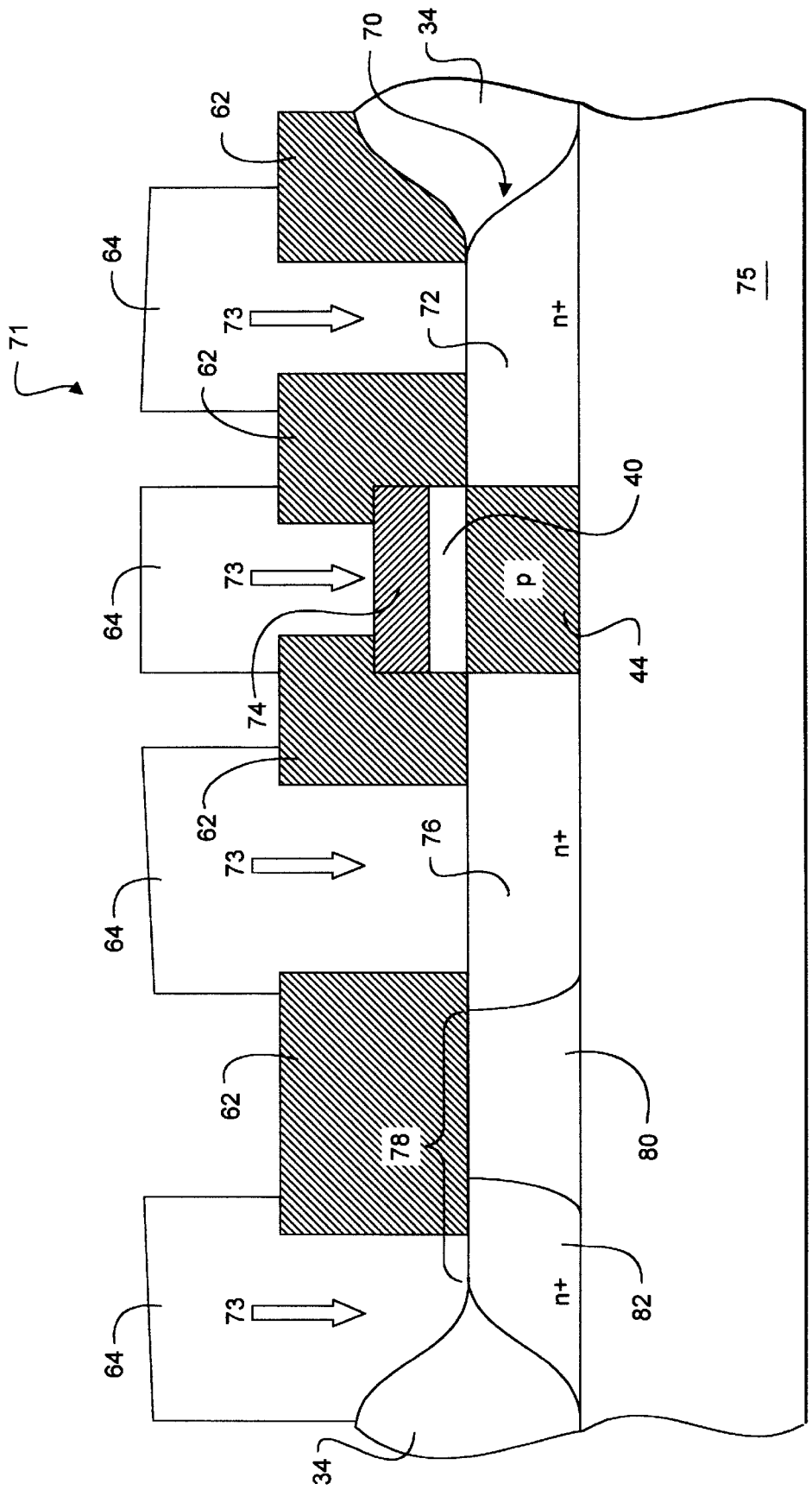
FIG. 4B shows a cross sectional view of the n-channel MOSFET shown in FIG. 4A

Referring to FIGS. 4A and 4B, the sapphire substrate 75 forms a diffusion barrier to the dopant atoms. This advantageously enables new thin source/drain regions with closely controlled resistivity to be formed by means of ion implantation or diffusion. For very thin doped regions, it is difficult to implant without going too deeply. For the aspect of the invention shown in FIG. 4A, wherein region 76 is an n$^+$ region approximately 100 nm thick, ion implantation is actually more effective than diffusion doping. Diffusion doping may be more effective at 50 nm thick films. Further, the depth of source and drain regions 72 and 76, respectively, is controlled by the structure of the diffusion barrier formed by the interface between the thin silicon layer or island 70 and sapphire substrate 75. This advantageously enables a higher doping concentration to be achieved. Thus, MOSFET 71, for example, may be an intrinsic surface channel MOSFET which is formed on silicon island 70 as was explained with reference to FIG. 2D.

Referring to FIG. 4A, a single silicon island formed in accordance with the process described with reference to FIG. 2A–2C provides a silicon processing base for MOSFET 71 and resistor 80. In FIG. 4A, an n-channel MOSFET 71 comprises a source 72, a gate 74 and drain 76 fabricated in ultrathin silicon on a sapphire substrate in accordance with the processes described with reference to FIG. 2D. A region 78 of the silicon island 70 extends from MOSFET 71. Silicon island 70 is formed by patterning nitride layer 32 of FIG. 2A–2C to result in the geometry shown in FIG. 4A. Thus, region 78 comprises a portion of and is integral with the ultra-thin silicon island 70 which makes up the MOSFET 71. An integrated resistor load 80 is formed within region 78 of island 70. Resistor load 80 is doped sufficiently to make it conductive to the desired degree, or can be left undoped for the highest possible resistivity. For example, resistor load 80 may be doped with phosphorus atoms at a concentration of less than $10^{16}$ cm$^{-2}$. The desired resistance value of the resistor load 80 is typically in the range of $10^8$–$10^9$ ohms for SRAMs. For analog components, resistor values in the range of 10–10,000 ohms are used. The resistance of resistor load 80 can be closely controlled by an ion implantation process as was set forth in the discussion referencing FIG. 2D. Of course, such ion implantation would occur prior to or during processing of MOSFET 71. For example, region 80 could be implanted during a threshold implant or LDD implant, or by means of special masking and implant steps prior to the N+source/drain implant. Region 80 is photolithographically protected from the N$^+$ implantation processes used to form MOSFET 71 and contact area 82.

Alternatively, resistor load 80 can be formed by selectively amorphizing it throughout its thickness. The process for creating such an amorphous region was set forth in the discussion with reference to FIG. 1B and following. However, in this application the ion implant energy and dose are chosen to amorphize the entire film thickness. It is necessary to mask the remainder of the integrated circuit before using the step of FIG. 1B to a amorphize resistor region 80. Only the resistor regions should be amorphized, otherwise the transistors may be damaged. The amorphized region 80 of island 70 is then annealed at a temperature sufficient to convert the amorphized portion to polycrystalline silicon. Such a thermal anneal step comprises heating the wafer to a temperature above 650° C. in an atmosphere of nitrogen gas. The thermal anneal to polycrystalline silicon normally occurs as part of the MOSFET source/drain dopant activation step. Subsequently, doping techniques as described with reference to FIG. 2D may be employed to precisely control the desired resistance of resistor load 80.

As is well known to those skilled in the art, the foregoing doping techniques can be proportioned as used in appropriate combinations to achieve precisely desired load characteristics for resistor load 80. These characteristics include the ability to achieve a desired resistance value, size, temperature coefficient or other parameters for enhanced manufacturability. In general, higher dopant concentrations or anneal temperatures will result in lower resistivity values.

A heavily doped n$^+$ region 82, bounded by W×L$_c$ provides a contact to the resistor load 80. Heavily doped n$^+$ region 82 is also formed by patterning and during the NMOS source/drain implant. The doped region 82 will be contacted by metal during subsequent processing. The resistor load 80 can be lightly doped in accordance with techniques which are well known in order to control its polarity. Alternatively, resistor load 80 can comprise single crystal silicon on polycrystalline silicon. Its resistance value equals its length divided by its width times p$_s$ or sheet resistivity (Ω/□); R=p$_s$ × L/W, where p$_s$ equals the sheet resistivity of the ultrathin silicon layer.

It will be appreciated from FIGS. 4A and 4B that resistor load 80 and drain source regions 76 and 72 of MOSFET 71 are constructed in the same silicon film and in the same silicon island formed in a single patterning step. The resistor load 80 is thus self-aligned to the MOSFET 71. Since resistor load 80 is fabricated from the same silicon island as MOSFET 71, a layer of high resistivity polycrystalline silicon (polysilicon), inter-level dielectric and associated masking steps advantageously can be eliminated from the process steps which would otherwise be required to integrate a resistor load. For example, since the ultra thin film silicon on sapphire resistor load 80 is formed in the island region 78, it is self-aligned to an NMOS transistor (such as MOSFET 71) and requires no contact or second layer of polysilicon to form the resistive load. This also eliminates processing steps necessary to form resistor loads in conventional techniques for fabricating a 4 T SRAM.

In addition, because the resistor load 80 is made of ultrathin silicon material, and disposed over sapphire substrate 75 it is extremely uniform in film thickness and resistivity, resulting in accurate resistance values. Since the silicon film begins as an intrinsic or lightly doped layer, its resistivity can be very high, resulting in compact high value resistors. Finally, because resistor load 80 is disposed on sapphire substrate 75, it has no parasitic capacitance to an underlying depletion region, which would be the case if a diffused resistor were made in bulk silicon. This advantage is described with respect to FIG. 2D. Here also, the sapphire substrate 75 advantageously acts as a diffusion barrier.

The ultra thin silicon disposed on the sapphire substrate 75 overcomes a principal disadvantage in conventional MOSFET integrated circuits in that the silicon on sapphire layer inhibits the formation of spurious channels or the formation of regenerative, parasitic bipolar transistor action. The silicon on sapphire configuration thus acts as a channel stopping measure which can enable MOSFET integrated circuits to be fabricated with greater component density.

FIG. 4B shows a cross-sectional view of the embodiment of FIG. 4A. The elements shown in FIG. 4B are the same elements in FIG. 4A FIG. 4B demonstrates where n and p type dopants are implanted by the aforedescribed methods into the MOSFET 71. In accordance with an aspect of the invention, contact openings 73 to the structure are formed at gate 74 and n+ regions 72 (source), 76 (drain) and 82 (contact to resistor load 80) as previously described in FIG. 1B.

An aspect of the present invention provides that resistor load 80 and MOSFET 71 are formed in a single silicon island. Due to the integral formation of resistor load 80 with drain 76, the addition of a dopant to resistor load 80 easily can be controlled to provide overvoltage protection to the MOSFET 71. It will be appreciated that integral resistor load 80 also can be implemented in other overvoltage protection circuits, such as in electrostatic discharge (ESD) circuitry.

It also will be appreciated that resistor load 80 of the present invention advantageously can be made as small as the lithography limit of the first masking step. Its size is significantly smaller than both PMOS transistors substituted for resistors in conventional 6 T SRAMs and the resistors currently used in 4 T SRAMs. As a result, this aspect of the invention ultimately can achieve a considerable downsizing of an SRAM memory cell over a conventional 4 T SRAM.

The sapphire substrate 75 acts as a diffusion barrier. It will be appreciated that the source 72 and drain 76, of MOSFET 71, as well as resistor load 80, are fabricated in an ultra thin layer of silicon disposed on sapphire substrate 75. Thus, the depth of the source 72 and drain 76 is determined by the thickness of the silicon layer, that is, by structure, rather than by diffusion time and temperature as in conventional transistor processing. This has the advantage of simplifying processing steps and further provides increased control of device parameters especially for very thin regions (less than 100 nm). Accordingly, the depths of the source and drain can be more precisely controlled than was previously possible. This enables the resistance of the resistor load 80 to be closely controlled by the previously described methods of ion implantation while substantially preventing the formation of defects or parasitic capacitances. It will be appreciated that logic devices, such as an NMOS transistors as shown in FIG. 4B, can be closely spaced by employing a self-aligned silicide process. In accordance with this aspect of the invention, n- and p-channel transistors, therefore, need not be spaced apart and can be interconnected by self-aligned silicide regions. This can reduce the area of an SRAM cell and thereby can achieve greater device density and increased memory capacity.

Figure 4C:
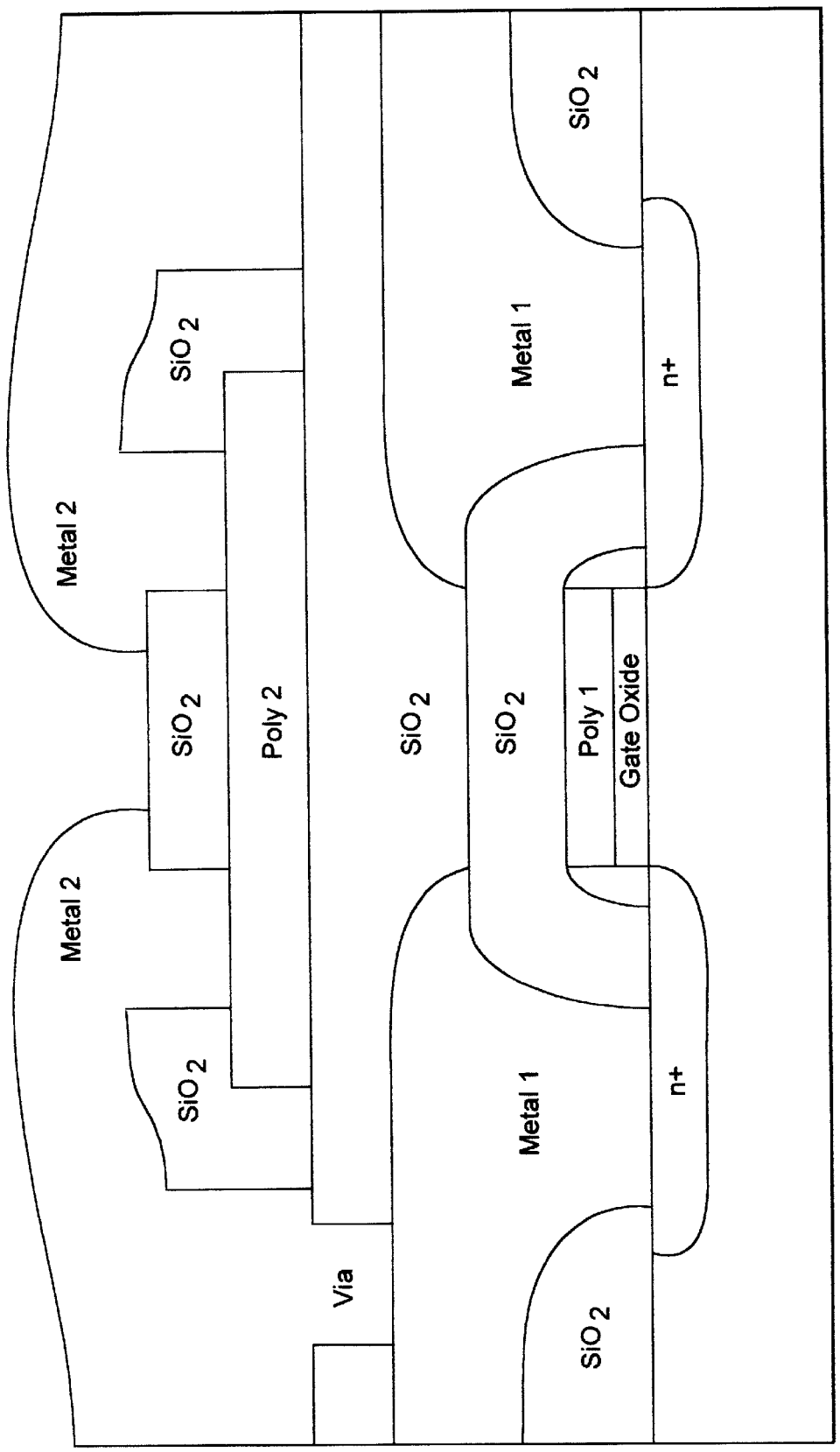
FIG. 4C shows a cross sectional view of a transistor and resistor from a conventional 4 T SRAM cell.

FIG. 4C shows a cross sectional view of a MOSFET and a resistor from a conventional four transistor SRAM cell. The location of transistors and connections are well known to those skilled in the art and are omitted for the sake of simplicity. A principal disadvantage of the SRAM cell of FIG. 4C is the high topography which must be present in the metal layers (metal 1 and 2), and in the layers of polycrystalline silicon (Poly 1 and 2). In order to build such a conventional SRAM with the required resistance levels, an extra layer of polysilicon (Poly 2) must be used. Typically the first polysilicon layer (Poly 1) is characterized by a thickness of approximately 300 nm. A layer of CVD oxide (for example, $SiO_2$) is disposed above the first polysilicon layer. The $SiO_2$ layer typically has a thickness of approximately 500 nm to successfully protect and stabilize the underlying channel region. A second layer of polycrystalline silicon (Poly 2) is disposed over the CVD oxide layer. The Poly 2 layer further must be fabricated with a thickness on the order of 300 nm and a high resistivity to provide sufficient resistance values. The result is a device having disadvantageously high topography, as shown in FIG. 4C.

In contrast, using the integrated self-aligned resistor load 80 of the present invention in a 4 T SRAM eliminates the need for a second layer of polysilicon. Because the resistor load 80 can be self-aligned to the transistor drain as shown in FIG. 4A and 4B, it is possible to construct a transistor for an SRAM having no additional topography height due to addition of the integrated resistor.

Referring again to FIG. 4B, in addition to the benefits of process simplicity and compact cell size due to the elimination of a second polysilicon layer, the integral resistor load 80 according to one aspect of the invention offers other significant advantages for a 4 T SRAM provided in ultrathin silicon on sapphire. One advantage comprises reduced parasitic capacitance between the resistor load 80 and gate 74 or Si substrate. Other advantages include improved process characteristics, including better control of load resistor resistivity, elimination of layer alignment and electrical connection difficulties, and reduced topography for easier lithography, etching and planarization. Yet a further advantage of the integral resistor load 80 comprises higher production yields resulting from the elimination of masking layers of the conventional 4T SRAM process and reduced critical area as compared to conventional 4T SRAMs. This aspect of the invention also provides the advantage of greater process reliability because no contacts are required to connect additional layers of material. Employing an integral resistor load 80 eliminates the second polysilicon layer and creates a smaller device with reduced critical area in which chances of defects decrease. All the foregoing advantages ultimately lower cost of SRAM fabrication.

Figure 4D:
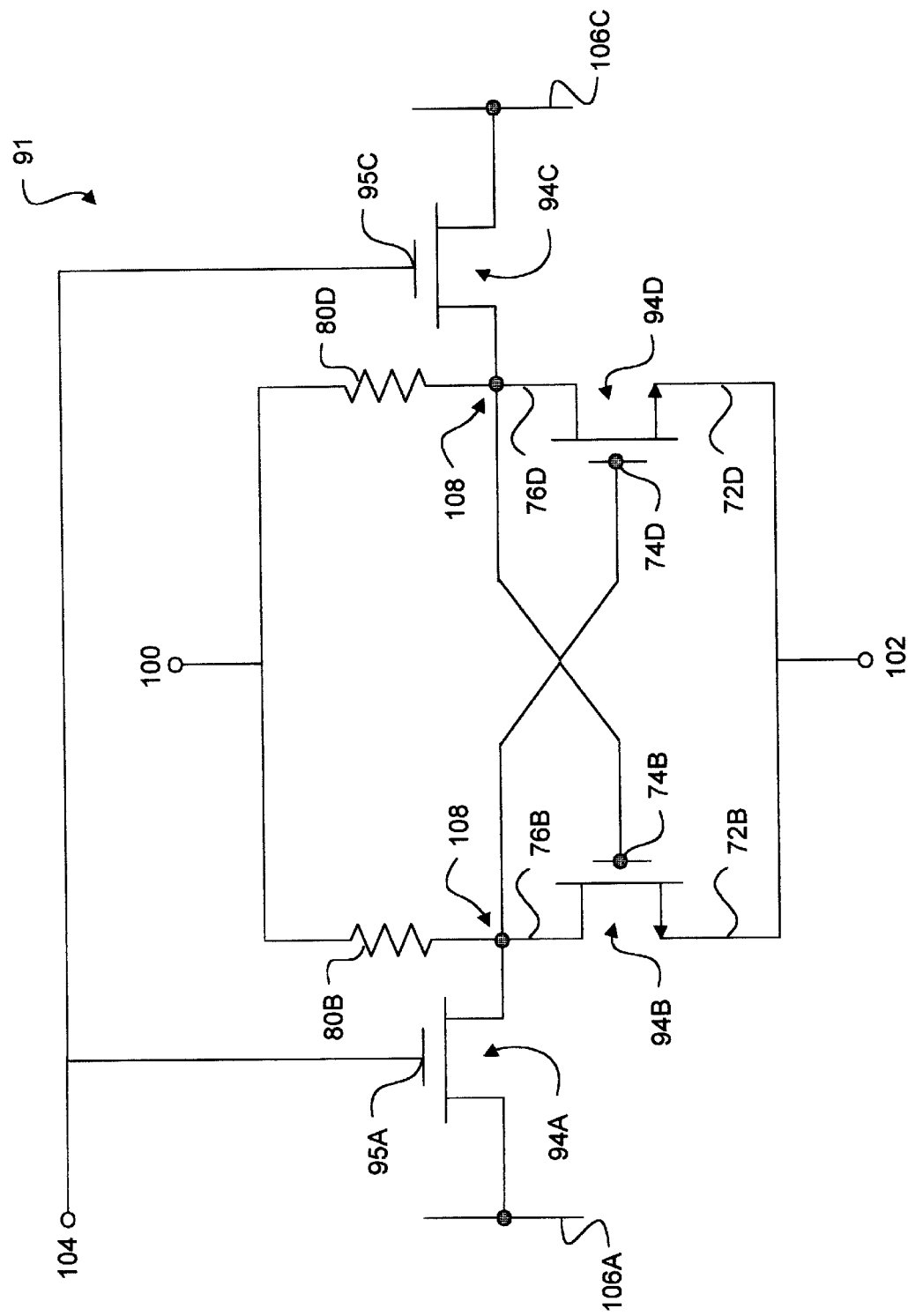
FIG. 4D shows an electrical schematic diagram of a four transistor SRAM cell fabricated in either bulk Si or ultrathin silicon on sapphire in accordance with an aspect of the present invention.

FIG. 4D illustrates a circuit diagram of an embodiment of a 4 T SRAM cell 91. This circuit is the same for an SRAM manufactured in bulk Si or in the ultra-thin silicon described herein. SRAM 91 comprises four n-channel transistors 94A, 94B, 94C and 94D. The resistor loads for the SRAM cell 91 are shown at 80B and 80D. Resistor load 80B is coupled between the supply voltage Vcc and the drain of NMOS transistor 94B. Resistor load 80B is also coupled to the gate 74D of NMOS transistor 94D and to the internal node of transistor 94A.

The source of NMOS transistor 94B is connected to ground. Similarly, resistor load 80D is coupled with the drain 76D of NMOS 94D and with the gate 74B of NMOS transistor 94B. The NMOS transistors are cross coupled in a well known manner.

The operation of the circuit of FIG. 4D is well known. MOSFETs 94B, 94D and resistors 80B and 80D form a flip-flop that stores the bit logic state of the cell. A logic 0 is represented when MOSFET 94B is on and 94D is off, for example. In this state, the gate 74B of MOSFET 94B is pulled to Vcc 100 through load resistor 80D. The MOSFET 94B pulls the gate 74D of MOSFET 94D to Vss 102. A logic 1 is represented when MOSFET 94B is off and 94D is on, for example. In this state, the gate 74B of MOSFET 94B is pulled to Vss 102 by MOSFET 94D. The gate 74D of MOSFET 94D is pulled to Vcc 100 through load resistor 80B.

MOSFETs 94A and 94C act as transmission gates that isolate or connect the logic outputs 108 of the cell with the bit lines 106. These two transistors are turned on and off by word line 104.

To write data into the cell, the gates 95A and 95C of MOSFETs 94A and 94C, respectively, are first held positive. This is done by selecting the row with the word (also called row select) line 104. The cell is chosen by also providing power to the bit lines 106A and 106C. Upon selecting the cell, the drain 76B of MOSFET 94B is connected to bit line 106A and the drain 76D of MOSFET 94D is connected to bit line 106C. A logic 1 is written to the cell by forcing bit line 106A to logic 1 and bit line 106C to logic 0. Forcing the bit lines to these levels turns on MOSFET 94D and turns off MOSFET 94B. At this point, turning off the MOSFETs 94A and 94C causes the cell to maintain this logic 1 state. A logic 0 is written to the cell in a similar manner.

As is well known to those of ordinary skill in this field, the cell can be read by again turning on MOSFETs 94A and 94C. Instead of applying a data bit to the cell through the bit lines, however, the SRAM sense amplifier circuitry (not shown) determines the status of the bit lines to determine what logic level is stored in the cell.

With process simplicity and reliability, compact cell size, uniform film thickness, and versatile load characteristics due to the self-aligned, integrated resistor loads, the SRAM cell 91 fabricated in ultrathin silicon on sapphire technology generates an efficient, low cost device in comparison to a conventional SRAM incorporating MOSFET transistors.

Figure 5:
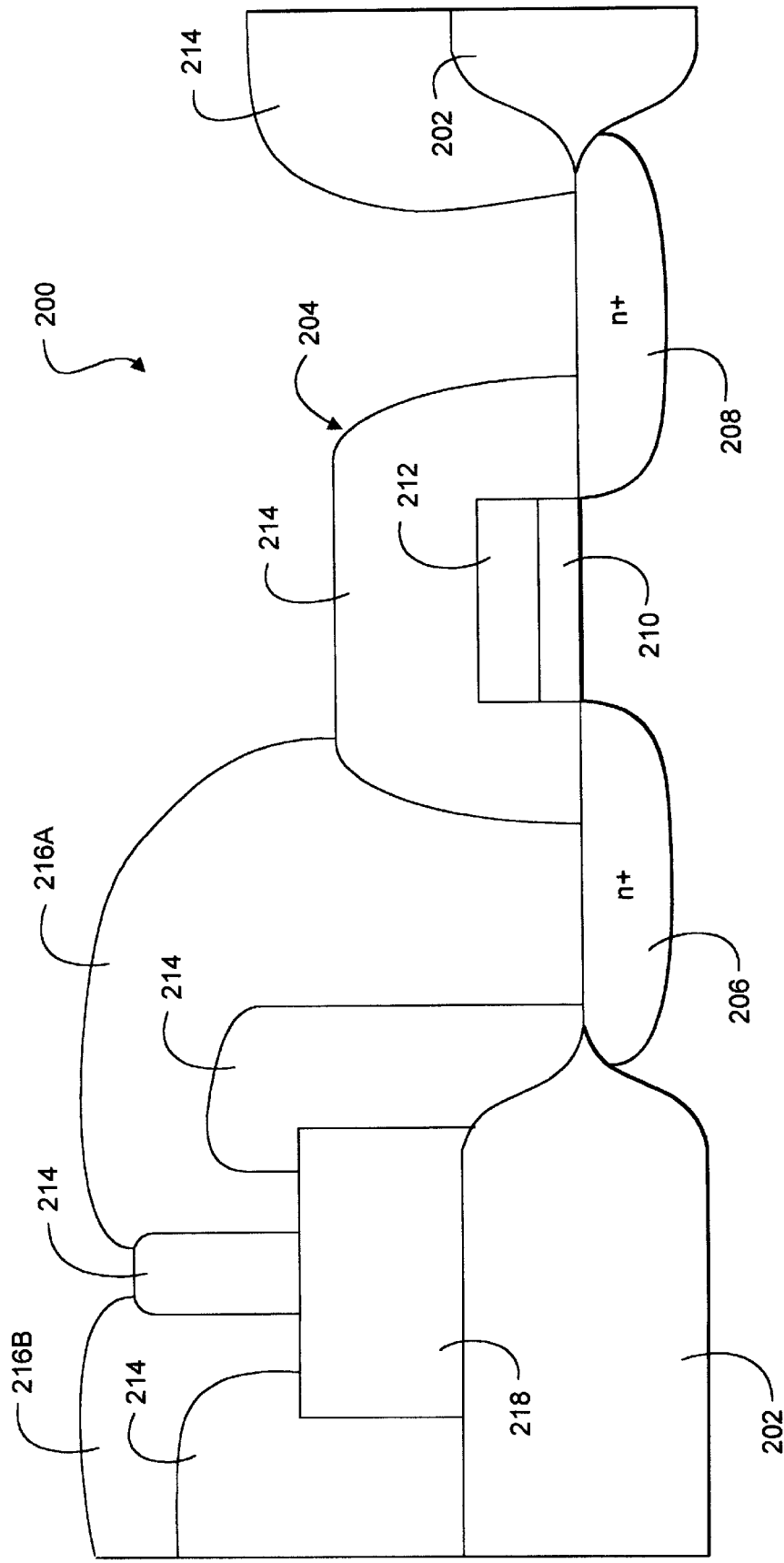
FIG. 5 shows a cross sectional view of a mix-signal or analog cell employing a self-aligned integrated resistor load according to the present invention.

FIG. 5 shows a cross sectional view of a conventional mixed signal or analog cell 200 which can be modified by inclusion of the integrated self-aligned resistor load 80 of the present invention. Such a mixed signal or analog cell incorporating integrated resistor load 80 can be made with greatly reduced dimensions while at the sate time reducing the number of processing steps.

For the sake of example, analog cell 200 comprises a first transistor 204 having a drain 206, a source 208 and a gate 212. A first low resistivity layer of polycrystalline silicon 212 is provided over gate oxide 210 in a well known manner. A CVD oxide, for example, $SiO_2$ layer 214 is provided over the polycrystalline silicon layer 212. $SiO_2$ layer 214 provides insulation between a first metal layer 216 and polysilicon 212. Metal interconnect 216A connects drain 206 and resistor 218 made in a second polysilicon layer to ensure higher resistivity than the first polysilicon layer 212. A second metal interconnect 216B connects the other side of resistor 218 to another part of the circuit.

In an aspect of the current invention and referring to FIG. 4B, integrated resistor 80 replaces resistor 218 and metal interconnect region 216A. Integrated resistor 80 has less topography height and consumes less area. As a further result of the self-aligned aspect and reduced topography, integrated resistor 80 also requires fewer processing and lithography steps.

While the Applicant has described the invention in terms of an embodiment, the invention is not limited to or by this disclosed embodiment. Thus, there may be numerous other aspects of the invention which will be obvious to one skilled in the art, including but not limited to changes in the dimensions of the regions forming the devices, the type of processes used to fabricate devices, the specific circuit designs and the type of components which can be fabricated with a self-aligned resistor load according to the present invention. For example, one of ordinary skill in the art readily can employ the self-aligned resistor load of the present invention advantageously in other integrated circuit applications. Examples of such applications include, without limitation, a cell for analog or mixed signal applications, or an elecrostratic discharge (ESD) circuit. It will be appreciated that the four transistor SRAM cell is the most demanding of the applications described herein.

It will be appreciated by one of ordinary skill in the art, that the resistor load of the present invention also can be self-aligned to another resistor, to a capacitor or even to an inductor or to multiple components. In such a case, the self-aligned resistor load according to this aspect of the present invention would provide the same advantages as previously described.

The SRAM cell should be seen as only one specific implementation of the invention. The invention described herein is not limited to a four transistor SRAM cell, but rather is intended to apply to many other components and equivalent structures, such as analog components which can be fabricated with reduced dimensions using the self-aligned resistor load in accordance with the present invention. Therefore, persons of ordinary skill in this field are to understand that all such equivalent structures are to be included within the scope of the following claims.

What is claimed is:

1. A method for making a self-aligned resistor load for a minimum topography integrated circuit comprising the steps of:

providing a sapphire substrate;

providing a first silicon layer over said sapphire substrate;

providing a polysilicon layer over said first silicon layer for defining a gate of a transistor to be formed in said first silicon layer;

forming a silicon island in the first silicon layer;

implanting said silicon island with a desired conductivity determining material to form a resistor region providing an integral resistor load coupled with said integrated circuit.

2. A method for making a self-aligned resistor load as in claim 1 further comprising the steps of providing a first layer of single crystal silicon over said sapphire substrate;

amorphizing the resistor region of said layer of single crystal silicon to form an amorphous region;

annealing said amorphous region to convert it to a polycrystalline state.

3. The method for forming an integrated self-aligned resistor load for an integrated circuit of claim 2 wherein said step of providing a layer of silicon on a surface of a sapphire substrate is comprised of epitaxially depositing a layer of silicon having a thickness in the range of from 250 nm to approximately 270 nm.

4. A method for forming an integrated self-aligned resistor load for an integrated circuit comprising the steps of:

providing a wafer with a layer of silicon on a surface of a sapphire substrate;

implanting a given ion species into said layer of silicon under such conditions that said implanted ions form a buried amorphous region in said layer of silicon which extends substantially from said surface of said sapphire substrate into said layer of silicon, thus leaving a surface layer of monocrystalline silicon covering said buried amorphous region;

maintaining said layer of silicon at or below a predetermined temperature which is substantially uniform throughout said layer of silicon during said ion implanting step;

annealing said wafer to induce solid phase epitaxial growth of said buried amorphous region using said surface layer of monocrystalline silicon as a crystallization seed;

removing an upper portion of said layer of silicon leaving a thin film of silicon which underwent said solid phase epitaxial growth;

patterning a predetermined portion of said layer of silicon to provide an island of said layer of silicon;

ion implanting said island with a conductivity determining material to substantially set a predetermined resistivity and to form an integral resistor load self-aligned in said layer of silicon.

5. The method for forming an integrated self-aligned resistor load for an integrated circuit of claim 4 wherein the step of providing the layer of silicon on the sapphire substrate further comprises the step of performing a high temperature anneal sequence at or below approximately 950° C. in a non-oxidizing environment thereby removing residual defects in said layer of silicon without introducing bandgap or interface states.

6. The method for forming an integrated self-aligned resistor load for an integrated circuit of claim 4 wherein said step of performing a high temperature anneal sequence in a non-oxidizing environment to remove residual defects in said layer of silicon without introducing bandgap or interface states further comprises selecting the temperature of said high temperature anneal to be within the range of from approximately 900° C. to approximately 950° C.

7. The method for forming an integrated self-aligned resistor load for an integrated circuit of claim 4 wherein the step of providing the layer of silicon on the sapphire substrate further comprises the steps of:

oxidizing a portion of said layer of silicon thereby leaving a thin layer of intrinsic silicon interposed between said sapphire substrate and said oxidized layer; and etching away said oxidized layer.

8. The method for forming an integrated self-aligned resistor load for an integrated circuit of claim 7 wherein the step of providing the layer of silicon on the sapphire further comprises the step of controlling said steps of oxidizing and etching to reduce said layer of silicon on said sapphire substrate to a thickness which is in the range from approximately 50 nm to approximately 110 nm.

9. The method for forming an integrated self-aligned resistor load for an integrated circuit of claim 4 wherein said step of implanting a given ion species into said layer of silicon further comprises the steps of:

selecting silicon as said given ion species; and selecting the energy and intensity of said silicon ions from within a range of energy and intensity values having a lower limit which is sufficient to amorphize said buried region of silicon and an upper limit which is insufficient to release substrate-originated contaminants into said layer of silicon.

10. The method for forming an integrated self-aligned resistor load for an integrated circuit of claim 9 wherein said step of selecting said silicon intensity further comprises selecting said silicon ion intensity to be within the range of from approximately $5 \times 10^{14}$ cm$^{-2}$ to approximately $7 \times 10^{14}$ cm$^{-2}$ energy and substrate temperature near or below approximately 0° C.

* * * * *